(12) United States Patent
Wang et al.

(10) Patent No.: US 12,310,180 B2
(45) Date of Patent: May 20, 2025

(54) DISPLAY PANEL HAVING REDUNDANT PIXEL CIRCUITS AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Binyan Wang, Beijing (CN); Yudiao Cheng, Beijing (CN); Yue Long, Beijing (CN); Benlian Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/778,154

(22) PCT Filed: Oct. 29, 2021

(86) PCT No.: PCT/CN2021/127590
§ 371 (c)(1),
(2) Date: May 19, 2022

(87) PCT Pub. No.: WO2022/227461
PCT Pub. Date: Nov. 3, 2022

(65) Prior Publication Data
US 2024/0179944 A1 May 30, 2024

(30) Foreign Application Priority Data
Apr. 29, 2021 (WO) ................ PCT/CN2021/091004

(51) Int. Cl.
*H10K 59/121* (2023.01)
*H10K 59/131* (2023.01)
*H10K 59/88* (2023.01)

(52) U.S. Cl.
CPC ....... *H10K 59/1213* (2023.02); *H10K 59/131* (2023.02); *H10K 59/88* (2023.02)

(58) Field of Classification Search
None
See application file for complete search history.

(56) References Cited

U.S. PATENT DOCUMENTS

2018/0204889 A1 7/2018 Yu et al.
2020/0176526 A1 6/2020 Yoon et al.
(Continued)

FOREIGN PATENT DOCUMENTS

CN 109004007 A 12/2018
CN 110021646 A 7/2019
(Continued)

OTHER PUBLICATIONS

PCT International Search Report (with English translation) and Written Opinion for corresponding PCT Application No. PCT/CN2021/127590, mailed Dec. 23, 2021, 9 pages.
(Continued)

*Primary Examiner* — Nduka E Ojeh
(74) *Attorney, Agent, or Firm* — Dority & Manning, P.A.

(57) ABSTRACT

A display panel has a main display region and a functional device region, and the main display region is located at at least part of sides of the functional device region. The display panel includes a plurality of first pixel circuits and a plurality of redundant pixel circuits. The plurality of first pixel circuits are located in the main display region. The display panel includes an active layer and an anode layer. The plurality of redundant pixel circuits include at least a (Continued)

column of redundant pixel circuits arranged in a second direction, and the column of redundant pixel circuits is located between the functional device region and a column of first pixel circuits. A redundant pixel circuit includes at least redundant active layer patterns located in the active layer, and the redundant pixel circuit is electrically insulated from the anode layer.

20 Claims, 11 Drawing Sheets

(56) References Cited

U.S. PATENT DOCUMENTS

| | | | |
|---|---|---|---|
| 2020/0176527 A1 | 6/2020 | An et al. | |
| 2020/0219944 A1 | 7/2020 | Yi | |
| 2020/0380915 A1 | 12/2020 | Yoon et al. | |
| 2021/0050405 A1 | 2/2021 | Na et al. | |
| 2021/0280128 A1* | 9/2021 | Shen | G09G 3/3225 |
| 2022/0069047 A1* | 3/2022 | Yang | H10K 59/88 |
| 2022/0262889 A1 | 8/2022 | Song et al. | |
| 2022/0310742 A1* | 9/2022 | Yi | H10K 59/131 |
| 2022/0310743 A1* | 9/2022 | Yi | H10K 59/123 |
| 2022/0336538 A1 | 10/2022 | Zhang et al. | |
| 2023/0354661 A1 | 11/2023 | Yang et al. | |

FOREIGN PATENT DOCUMENTS

| | | |
|---|---|---|
| CN | 110571248 A | 12/2019 |
| CN | 111028692 A | 4/2020 |
| CN | 112259575 A | 1/2021 |
| CN | 112562518 A | 3/2021 |
| CN | 112670304 A | 4/2021 |
| CN | 112670327 A | 4/2021 |
| EP | 4075512 A1 | 10/2022 |
| WO | WO2020219267 A1 | 10/2020 |

OTHER PUBLICATIONS

PCT International Search Report and Written Opinion (with English translation) for corresponding PCT Application No. PCT/CN2021/091004, mailed Jan. 29, 2022, 15 pages.

Extended European Search Report for corresponding EP Application No. 21938924.4, dated Feb. 21, 2024, 11 pages.

* cited by examiner

DISPLAY PANEL HAVING REDUNDANT PIXEL CIRCUITS AND DISPLAY DEVICE

CROSS-REFERENCE TO RELATED APPLICATIONS

This application is a national phase entry under 35 USC 371 of International Patent Application No. PCT/CN 2021/127590 filed on Oct. 29, 2021, which claims priority to PCT Patent Application No. PCT/CN 2021/091004, filed on Apr. 29, 2021, which are incorporated herein by reference in their entirety.

TECHNICAL FIELD

The present disclosure relates to the field of display technologies, and in particular, to a display panel and a display device.

BACKGROUND

An organic light-emitting diode (OLED) display panel includes a plurality of sub-pixels. Each sub-pixel includes a pixel circuit and a light-emitting device that are stacked on a substrate, and the pixel circuit includes an active layer pattern. In a process of manufacturing pixel circuits in the plurality of sub-pixels of the display panel, pixel circuits located in a region, proximate to an under-screen camera, of the display panel have a poor uniformity due to an influence of a manufacturing process, which results in a threshold voltage ($V_{th}$) shift of the pixel circuits in this region, and further results in an abnormal light emission of the sub-pixels in the region (e.g., dark spots, bright spots, or different colors appear).

SUMMARY

In an aspect, a display panel is provided. The display panel has a main display region and a functional device region, and the main display region is located at at least part of sides of the functional device region. A light transmittance of the main display region is less than a light transmittance of the functional device region. The display panel includes a plurality of first pixel circuits and a plurality of redundant pixel circuits. The plurality of first pixel circuits are located in the main display region. First pixel circuits are arranged in a row of first pixel circuits in a first direction, and a plurality of rows of first pixel circuits are arranged in a second direction. The first direction intersects with the second direction. The display panel includes a substrate, and an active layer and an anode layer that are arranged on the substrate in sequence in a direction perpendicular to the substrate and away from the substrate. The plurality of redundant pixel circuits include at least a column of redundant pixel circuits arranged in the second direction. The column of redundant pixel circuits is located between the functional device region and a column of first pixel circuits. A redundant pixel circuit includes at least redundant active layer patterns located in the active layer, and the redundant pixel circuit is electrically insulated from the anode layer. Redundant active layer patterns in two adjacent redundant pixel circuits are same, and are separated from each other.

In some embodiments, at least two redundant pixel circuits arranged in the first direction are disposed at an edge, proximate to the functional device region, of any row of first pixel circuits intersecting with a boundary of the functional device region, and/or at least two redundant pixel circuits arranged in the second direction are disposed at an edge, proximate to the functional device region, of any column of first pixel circuits intersecting with the boundary of the functional device region.

In some embodiments, two to four redundant pixel circuits arranged in the first direction are disposed at the edge, proximate to the functional device region, of any row of first pixel circuits intersecting with the boundary of the functional device region. Two to four redundant pixel circuits arranged in the second direction are disposed at the edge, proximate to the functional device region, of any column of first pixel circuits intersecting with the boundary of the functional device region.

In some embodiments, the main display region includes a transition region adjacent to the functional device region, and the plurality of redundant pixel circuits are located in the transition region. The transition region includes a plurality of sub-transition regions each located at a side of the functional device region, and at least one sub-transition region is provided with redundant pixel circuits arranged in rows and columns therein. In a same sub-transition region, a number and a structure of redundant pixel circuits in a row are same as a number and a structure of redundant pixel circuits in an adjacent row, respectively.

In some embodiments, the plurality of sub-transition regions include a first sub-transition region and two second sub-transition regions. The first sub-transition region is located at a side of the functional device region in the second direction, and the first sub-transition region is provided with redundant pixel circuits in at least two rows therein. The two second sub-transition regions are respectively located at two opposite sides of the functional device region in the first direction, and each second sub-transition region is provided with redundant pixel circuits in at least two columns therein.

In some embodiments, the plurality of sub-transition regions further include four polyline transition regions. Each polyline transition region includes a plurality of sub-regions connected in sequence, and each sub-region is provided with redundant pixel circuits in rows therein. Redundant pixel circuits in rows located in a sub-region and redundant pixel circuits in rows located in a different sub-region are staggered in the first direction. The first sub-transition region is connected to the second sub-transition regions through respective polyline transition regions.

In some embodiments, the transition region has an annular shape with an opening at a side of the functional device region, and the opening of the transition region is opposite to the first sub-transition region in the second direction. Alternatively, the transition region has a closed annular shape, and the transition region further includes a third sub-transition region. In the second direction, the third sub-transition region is located at a side of the functional device region, and is opposite to the first sub-transition region. The third sub-transition region includes redundant pixel circuits in at least two rows.

In some embodiments, the plurality of redundant pixel circuits are arranged to form a pattern, and the pattern is symmetrical with respect to a line of the transition region in the first direction; and/or the plurality of redundant pixel circuits are arranged to form a pattern, and the pattern is symmetrical with respect to a line of the transition region in the second direction.

In some embodiments, each first pixel circuit includes a plurality of first thin film transistors and a first storage capacitor. The active layer further includes first active layer patterns of the plurality of first thin film transistors. The display panel further includes a first gate conductive layer, a second gate conductive layer and a source-drain conductive layer. The first gate conductive layer is disposed between the active layer and the anode layer, and includes first gate patterns in the plurality of first pixel circuits. The first gate patterns include gates of the plurality of first thin film transistors, a first electrode plate of the first storage capacitor, scan lines, and light-emitting control lines. The second gate conductive layer is disposed between the first gate conductive layer and the anode layer, and includes second gate patterns in the plurality of first pixel circuits. The second gate patterns include a second electrode plate of the first storage capacitor, first initialization signal lines, and second initialization signal lines. The source-drain conductive layer is disposed between the second gate conductive layer and the anode layer, and includes source-drain conductive patterns in the plurality of first pixel circuits. The source-drain conductive patterns include data lines and voltage signal lines. The voltage signal lines extend in the second direction, and a voltage signal line is electrically connected to first pixel circuits in at least one column.

In some embodiments, the plurality of first thin film transistors include a driving transistor. Driving transistors of two adjacent first pixel circuits in the second direction are provided with a first initialization signal line and a second initialization signal line therebetween.

In some embodiments, orthogonal projections of all patterns in the first gate conductive layer, all patterns in the second gate conductive layer, and all patterns in the source-drain conductive layer on the substrate are separated from orthogonal projections of redundant active layer patterns in the plurality of redundant pixel circuits on the substrate.

In some embodiments, the display panel further includes a first gate insulating layer, a second insulating layer, and an interlayer insulating layer. The first gate insulating layer is disposed between the active layer and the first gate conductive layer. The second insulating layer is disposed between the first gate conductive layer and the second gate conductive layer. The interlayer insulating layer is disposed between the second gate conductive layer and the source-drain conductive layer. The first gate insulating layer, the second gate insulating layer, and the interlayer insulating layer cover the redundant active layer patterns in the plurality of redundant pixel circuits. A plurality of via holes are provided in the first gate insulating layer, the second gate insulating layer and the interlayer insulating layer. Each via hole penetrates through the interlayer insulating layer, the second gate insulating layer and the first gate insulating layer, and an orthogonal projection of the via hole on the substrate is within an orthogonal projection of a redundant active layer pattern on the substrate.

In some embodiments, the display panel further includes a passivation layer. The passivation layer is disposed between the source-drain conductive layer and the anode layer, and covers the redundant active layer patterns in the plurality of redundant pixel circuits. The via hole is filled with a material of the passivation layer.

In some embodiments, the redundant pixel circuit includes a plurality of redundant thin film transistors and a redundant storage capacitor. The first gate conductive layer further includes first redundant gate patterns in the plurality of redundant pixel circuits. The first redundant gate patterns include gates of the plurality of redundant thin film transistors and a first electrode plate of the redundant storage capacitor. The second gate conductive layer further includes second redundant gate patterns in the plurality of redundant pixel circuits. The second redundant gate patterns include a second electrode plate of the redundant storage capacitor.

The source-drain conductive layer further includes redundant source-drain conductive patterns in the plurality of redundant pixel circuits. The redundant source-drain conductive patterns include sources and drains of the plurality of redundant thin film transistors. The redundant source-drain conductive patterns are electrically insulated from the anode layer.

In some embodiments, in two adjacent redundant pixel circuits in the second direction, redundant source-drain conductive patterns are connected.

In some embodiments, the display panel further includes a plurality of second pixel circuits, and the plurality of second pixel circuits are disposed in a region of the display panel other than the functional device region. The anode layer includes a plurality of first anodes and a plurality of second anodes. The plurality of first anodes are located in the main display region, and each first anode is electrically connected to a first pixel circuit. The plurality of second anodes are located in the functional device region, and each second anode is electrically connected to a second pixel circuit.

In some embodiments, the main display region includes a transition region adjacent to the functional device region, and the plurality of second pixel circuits are located in the transition region. In the transition region, a number of the second pixel circuits is less than a number of first pixel circuits; and/or the plurality of second pixel circuits are arranged in rows and columns, and two adjacent second pixel circuits in a same row are provided with first pixel circuits therebetween.

In some embodiments, the display panel includes a plurality of connection lines, and each second anode is electrically connected to the second pixel circuit through a connection line. The connection line includes a first line segment extending in the first direction and a second line segment extending in the second direction that are located in the transition region. The first line segment is electrically connected to the second line segment. The connection line further includes a third line segment located in the functional device region and a connection block located in the transition region. The third line segment is electrically connected to the first line segment, and the connection block is electrically connected to the second line segment. A material of the third line segment includes a transparent conductive material, and a material of the connection block includes a metal conductive material.

In some embodiments, the display panel further includes a transition conductive layer and at least one connection layer. The transition conductive layer is located between a film layer where the plurality of first pixel circuits and the plurality of second pixel circuits are located and the anode layer. The transition conductive layer includes a plurality of transition blocks that are separated from each other. The plurality of transition blocks include first transition blocks respectively electrically connected to the plurality of first pixel circuits, and second transition blocks respectively electrically connected to the plurality of second pixel circuits. The at least one connection layer is located between the transition conductive layer and the anode layer. The at least one connection layer includes a plurality of sub-connection lines. An end of a sub-connection line is electrically connected to a second transition block, and another end of the sub-connection line is electrically connected to a second anode. The connection line includes the sub-connection line, including the first line segment, the second line segment, the third line segment and the connection block.

In some embodiments, an orthogonal projection of a first transition block in the first transition blocks on the substrate covers a first connection node of a first pixel circuit electrically connected to the first transition block, and the first transition block is electrically connected to the first connection node. The first connection node is a node of the first pixel circuit configured to be electrically connected to a first anode. An orthogonal projection of a second transition block in the second transition blocks on the substrate covers a second connection node of a second pixel circuit electrically connected to the second transition block, and the second transition block is electrically connected to the second connection node. The second connection node is a node of the second pixel circuit configured to be electrically connected to a second anode.

In some embodiments, at least two connection lines are disposed between two adjacent redundant pixel circuits in the second direction. Orthogonal projections of the at least two connection lines on the substrate are separated from orthogonal projections of redundant active layer patterns in the two adjacent redundant pixel circuits on the substrate.

In some embodiments, the plurality of first pixel circuits and the plurality of second pixel circuits are disposed in the main display region. The plurality of second pixel circuits are arranged in rows and columns, and two adjacent second pixel circuits located in a same row are provided with first pixel circuits therebetween.

In some embodiments, the display panel further includes a bezel region located around the main display region. The plurality of second pixel circuits are disposed in the bezel region.

In some embodiments, the main display region includes a transition region adjacent to the functional device region, and the plurality of redundant pixel circuits are located in the transition region. The anode layer includes a plurality of first anodes located in the main display region, a plurality of second anodes located in the functional device region and a plurality of third anodes located in the transition region. Orthogonal projections of the plurality of third anodes on the substrate are separated from each other, and the orthogonal projections of the plurality of third anodes are overlapped with orthogonal projections of the plurality of redundant pixel circuits on the substrate. A third anode in the third anodes and a second anode in the second anodes have a same shape and a same area, and the third anode and a first anode in the first anodes have different shapes and different areas.

In some embodiments, a contour of an orthogonal projection of a first anode in the plurality of first anodes on the substrate includes a plurality of linear edges. A contour of an orthogonal projection of a second anode in the plurality of second anodes on the substrate includes a partially circular contour.

In some embodiments, the redundant pixel circuit includes a plurality of redundant thin film transistors. The plurality of redundant thin film transistors include a redundant compensation transistor, a redundant light-emitting control transistor and a redundant initialization transistor. Two adjacent redundant pixel circuits in the second direction include a first redundant pixel circuit and a second redundant pixel circuit. An orthogonal projection of a third anode on the substrate is overlapped with orthogonal projections of a gate of a redundant compensation transistor, and a redundant initialization transistor in the first redundant pixel circuit on the substrate.

In some embodiments, the display panel further includes light-emitting control lines. The orthogonal projection of the third anode on the substrate is overlapped with orthogonal projections of a redundant light-emitting control transistor in the second redundant pixel circuit, and a light-emitting control line in the light-emitting control lines on the substrate.

In some embodiments, a pixel density of the functional device region is same as a pixel density of the main display region.

In another aspect, a display device is further provided. The display device includes the display panel in any one of the above embodiments.

In yet another aspect, a method for manufacturing a display panel is further provided. The display panel has a main display region and a functional device region, and the main display region is located at at least part of sides of the functional device region. The display panel includes a plurality of first pixel circuits and a plurality of redundant pixel circuits. The plurality of first pixel circuits are located in the main display region, and the plurality of redundant pixel circuits are adjacent to first pixel circuits in the main display region proximate to the functional device region. The manufacturing method includes: manufacturing an active layer on a substrate; and manufacturing an anode layer on a side of the active layer away from the substrate. The active layer includes first active layer patterns in the plurality of first pixel circuits and redundant active layer patterns in the plurality of redundant pixel circuits. The anode layer includes a plurality of first anodes in the main display region, and each first anode is electrically connected to a first pixel circuit. The plurality of redundant pixel circuits are electrically insulated from the anode layer.

In some embodiments, each first pixel circuit includes a plurality of first thin film transistors and a first storage capacitor. After the active layer is manufactured on the substrate, and before the anode layer is manufactured on the side of the active layer away from the substrate, the manufacturing method further includes: manufacturing a first gate conductive layer on the side of the active layer away from the substrate; manufacturing a second gate conductive layer on a side of the first gate conductive layer away from the substrate; and manufacturing a source-drain conductive layer on a side of the second gate conductive layer away from the substrate. The first gate conductive layer includes first gate patterns in the plurality of first pixel circuits. The first gate patterns include gates of the plurality of first thin film transistors, a first electrode plate of the first storage capacitor, scan lines, and light-emitting control lines. The second gate conductive layer includes second gate patterns in the plurality of first pixel circuits. The second gate patterns include a second electrode plate of the first storage capacitor, first initialization signal lines, and second initialization signal lines. The source-drain conductive layer includes source-drain conductive patterns in the plurality of first pixel circuits. The source-drain conductive patterns include sources and drains of the plurality of first thin film transistors, data lines, and voltage signal lines.

Orthogonal projections of all patterns in the first gate conductive layer, all patterns in the second gate conductive layer, and all patterns in the source-drain conductive layer on the substrate are separated from orthogonal projections of the redundant active layer patterns on the substrate. Alternatively, each redundant pixel circuit includes a plurality of redundant thin film transistors and a redundant storage capacitor. The first gate conductive layer further includes first redundant gate patterns in the plurality of redundant pixel circuits. The first redundant gate patterns include gates of the plurality of redundant thin film transistors and a first electrode plate of the redundant storage capacitor. The second gate conductive layer further includes second redundant gate patterns in the plurality of redundant pixel circuits. The second redundant gate patterns include a second electrode plate of the redundant storage capacitor. The source-drain conductive layer further includes redundant source-drain conductive patterns in the plurality of redundant pixel circuits. The redundant source-drain conductive patterns include sources and drains of the plurality of redundant thin film transistors. The redundant source-drain conductive patterns are electrically insulated from the anode layer.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method, and an actual timing of a signal involved in the embodiments of the present disclosure.

DETAILED DESCRIPTION

Figure 1:
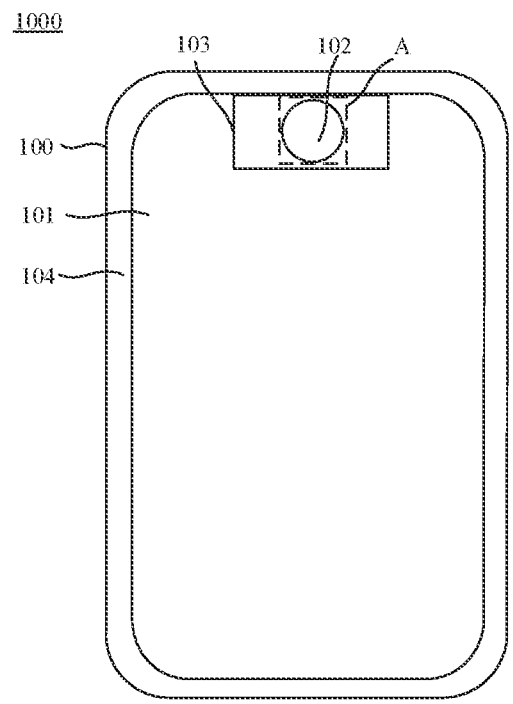
FIG. 1 is a structural diagram of a display panel, in accordance with some embodiments.

Technical solutions in some embodiments of the present disclosure will be described dearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "some embodiments," "exemplary embodiments," "an example," or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms "connected", "electrically connected" and their derivatives may be used. For example, the term "connected" may be used in the description of some embodiments to indicate that two or more components are in direct physical or electrical contact with each other. The embodiments disclosed herein are not necessarily limited to the contents herein.

The phrase "A and/or B" includes following three combinations: only A, only B, and a combination of A and B.

The use of the phrase "configured to" herein means an open and inclusive expression, which does not exclude devices that are applicable to or configured to perform additional tasks or steps.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Herein, the expression "arranged in a same layer" is used, which means that a film layer with specific patterns is formed by one patterning process using a same mask. Depending on the different specific patterns, the one patterning process may include several exposure, development or etching processes, the specific patterns in the formed layer structure may be continuous or discontinuous, and these specific patterns may also be at different heights or have different thicknesses.

Some embodiments of the present disclosure provide a display device 1000. Referring to FIG. 1, the display device 1000 may be a television, a computer, a notebook computer, a mobile phone, a tablet computer, a personal digital assistant (PDA), or a vehicle-mounted computer.

A technique of providing functional device(s) on a back side of a screen (i.e., a side facing away from a light exit surface of the screen) is used in the display device 1000. The functional device is a device that may realize a specific function, such as a front camera assembly, an under-screen fingerprint assembly, a three-dimensional (3D) face recognition assembly, an iris recognition assembly, or a proximity sensor. For example, in a case where the front camera assembly is provided on the back side of the screen, an under-screen camera technique is used in the display device 1000.

Referring to FIG. 1, the display device 1000 includes a display panel 100. In some embodiments, the display panel 100 may be an organic light-emitting diode (OLED) display panel.

The display panel 100 has a main display region 101, a functional device region 102, and a bezel region 104 located around the main display region 101. The functional device is provided on a back side of the functional device region 102, and the functional device needs to receive light from the outside when it operates. In order to improve a sensitivity of the functional device, it is necessary to ensure that the functional device is able to receive a sufficient amount of light, and a light transmittance of the functional device region 102 is required to be improved.

Figure 2:
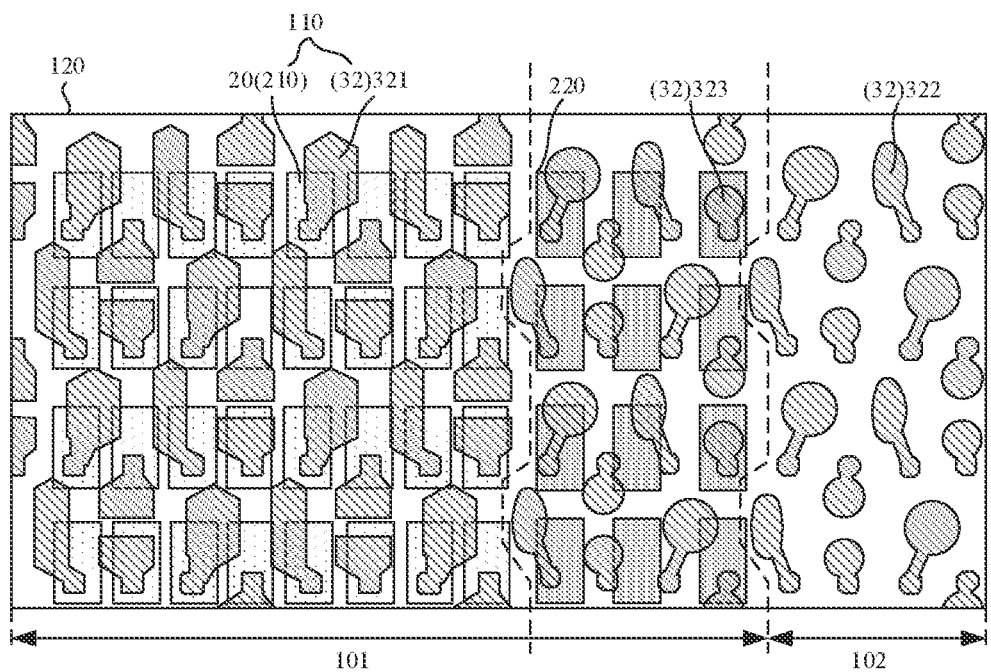
FIG. 2 is a structural diagram showing an arrangement of pixels in a boundary region of a main display region and a functional device region of a display panel.

Referring to FIG. 2, the display panel 100 includes a plurality of sub-pixels 110. The sub-pixel 110 includes a pixel circuit 20 disposed on a substrate 120 and an anode 32 disposed on a side of a film layer where the pixel circuit 20 is located away from the substrate 120. The anodes 32 in the plurality of sub-pixels 110 include first anodes 321 located in the main display region 101 and second anodes 322 located in the functional device region 102.

Referring to FIG. 2, in order to improve the light transmittance of the functional device region 102, pixel circuits 20 connected to respective second anodes 322 are disposed in a region of the display panel 100 other than the functional device region 102. That is, the functional device region 102 is not provided with the pixel circuits 20 therein, and only the second anodes 322 are retained. Thus, the light transmittance of the functional device region 102 may be improved, so that the light transmittance of the functional device region 102 is greater than a light transmittance of the main display region 101.

In a process of manufacturing pixel circuits in a plurality of sub-pixels of a display panel, pixel circuits in a region, proximate to an under-screen camera, of a display panel have a poor uniformity, which results in a threshold voltage ($V_{th}$) shift of the pixel circuits in the region, and further results in an abnormal light emission of sub-pixels where the pixel circuits are located (e.g., dark spots, or bright spots appear). That is, the pixel circuits included in the sub-pixels located in a main display region and dose to an edge of a functional device region have a poor uniformity, which results in the abnormal light emission of the sub-pixels located in the main display region and close to the functional device region.

Some embodiments of the present disclosure provide the display panel 100. Referring to FIG. 1, the display panel 100 has the main display region 101 and the functional device region 102. The main display region 101 is located at at least part of sides of the functional device region 102, and the light transmittance of the main display region 101 is less than the light transmittance of functional device region 102. For example, referring to FIGS. 3A and 3B, a part of a boundary of the functional device region 102 coincides with a part of a boundary of the bezel region 104, and the main display region 101 is located at part of the sides of the functional device region 102; or referring to FIG. 3C, a boundary of the functional device region 102 is separated from the bezel region 104, and the main display region 101 surrounds the functional device region 102. FIGS. 3A to 3E are partial enlarged views of A in FIG. 1 in different examples.

Referring to FIGS. 3A, 3B, 3C and 3D, the display panel 100 includes a plurality of first pixel circuits 210 and a plurality of redundant pixel circuits 220. The plurality of first pixel circuits 210 are located in the main display region 101, and first pixel circuits 210 are arranged in a row of first pixel circuits 210 in a first direction M1 (i.e., a horizontal direction in FIG. 3A). That is, the row of first pixel circuits 210 includes the first pixel circuits 210 arranged in the first direction M1. A plurality of rows of first pixel circuits 210 are arranged in a second direction M2 (i.e., a vertical direction in FIG. 3A). That is, in the second direction M2, the plurality of rows of first pixel circuits 210 are included.

The first direction M1 and the second direction M2 intersect with each other. For example, the first direction M1 and the second direction M2 are perpendicular to each other.

The plurality of redundant pixel circuits 220 are adjacent to first pixel circuits 210 that are disposed at an edge of the main display region 101 proximate to the functional device region 102. That is, the redundant pixel circuits 220 adjacent to the first pixel circuits 210 are disposed at a side, proximate to the functional device region 102, of the first pixel circuits 210 at the edge of the main display region 101 proximate to the functional device region 102.

For example, referring to FIGS. 3A, 3B, 3C and 3D, the plurality of redundant pixel circuits 220 include at least a column of redundant pixel circuits 220 arranged in the second direction M2, and the column of redundant pixel circuits 220 is located between the functional device region 102 and a column of first pixel circuits 210. The column of redundant pixel circuits 220 includes redundant pixel circuits 220 arranged in the second direction M2.

Figure 3A:
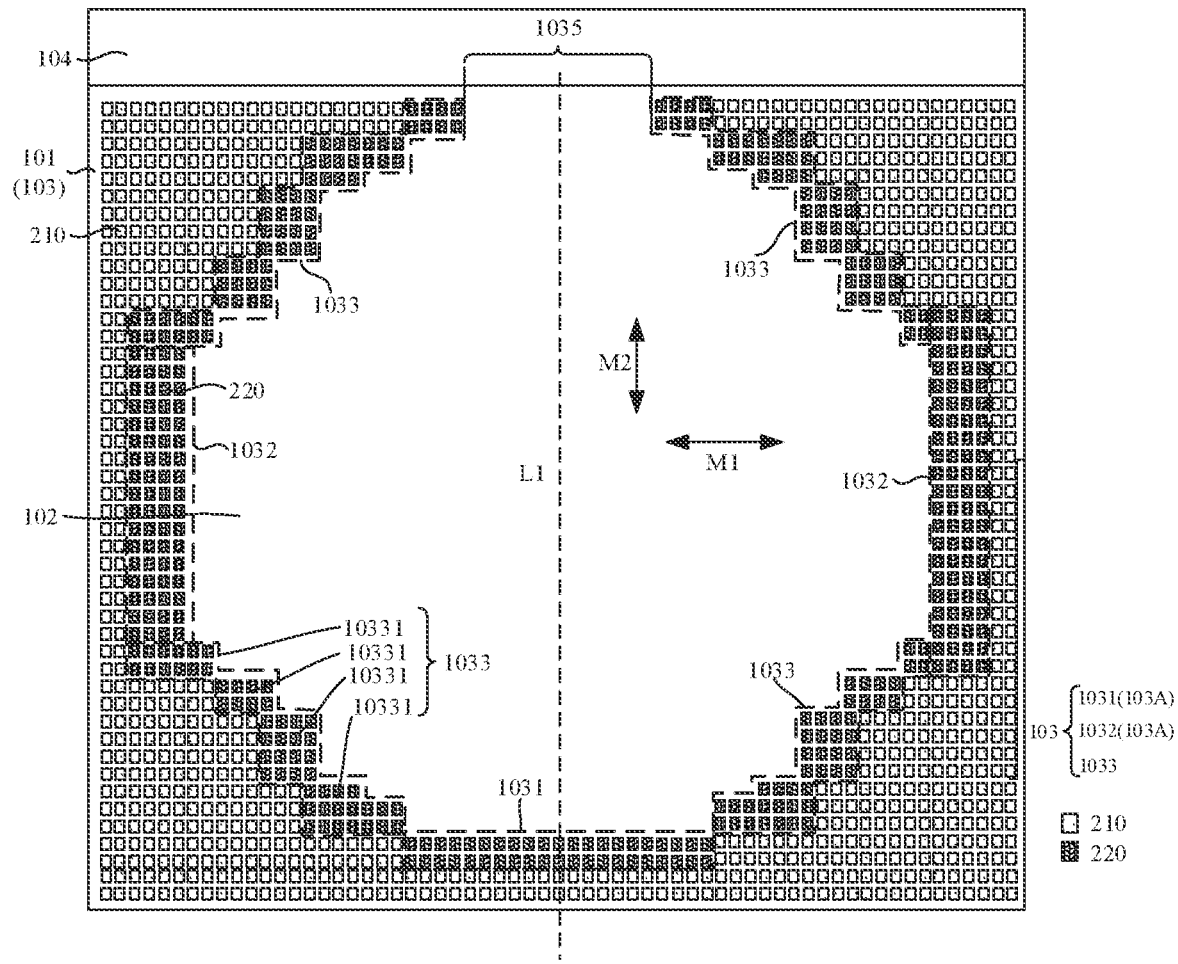
FIG. 3A is a structural diagram of a transition region, in accordance with some embodiments.
Figure 3B:
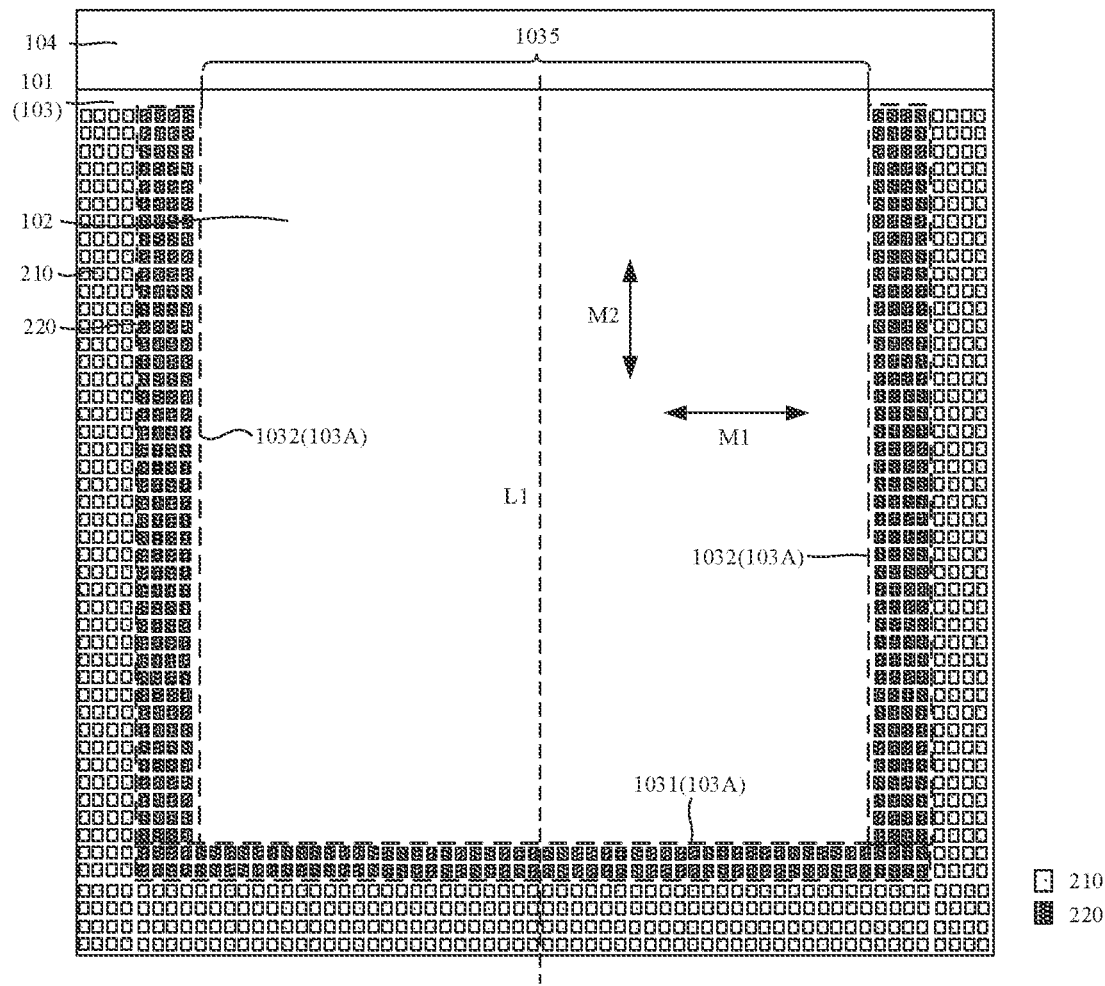
FIG. 3B is a structural diagram of another transition region, in accordance with some embodiments.

FIG. 3B is taken as an example, the plurality of redundant pixel circuits 220 include eight columns of redundant pixel circuits 220 each arranged in the second direction M2, and four columns of redundant pixel circuits 220 are disposed between a column of first pixel circuits 210 (e.g., a column of first pixel circuits 210 that is proximate to a left side of the functional device region 102) and the functional device region 102.

Figure 4:
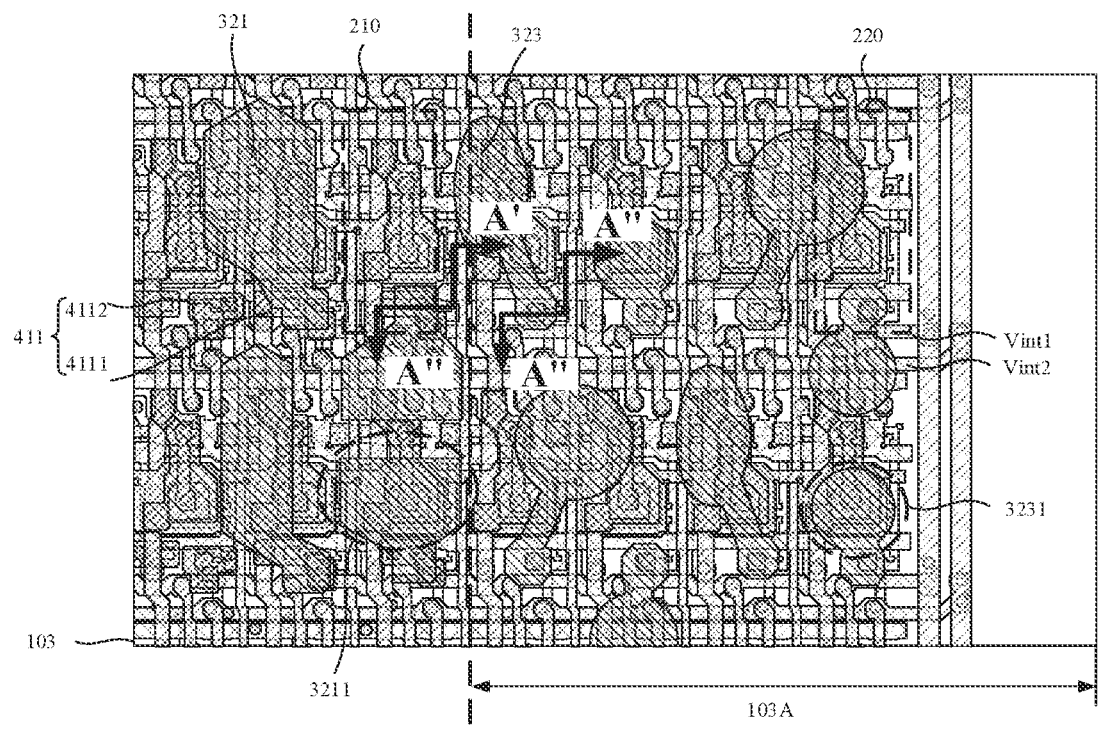
FIG. 4 is a structural diagram of sub-pixels, in accordance with some embodiments.
Figure 5A:
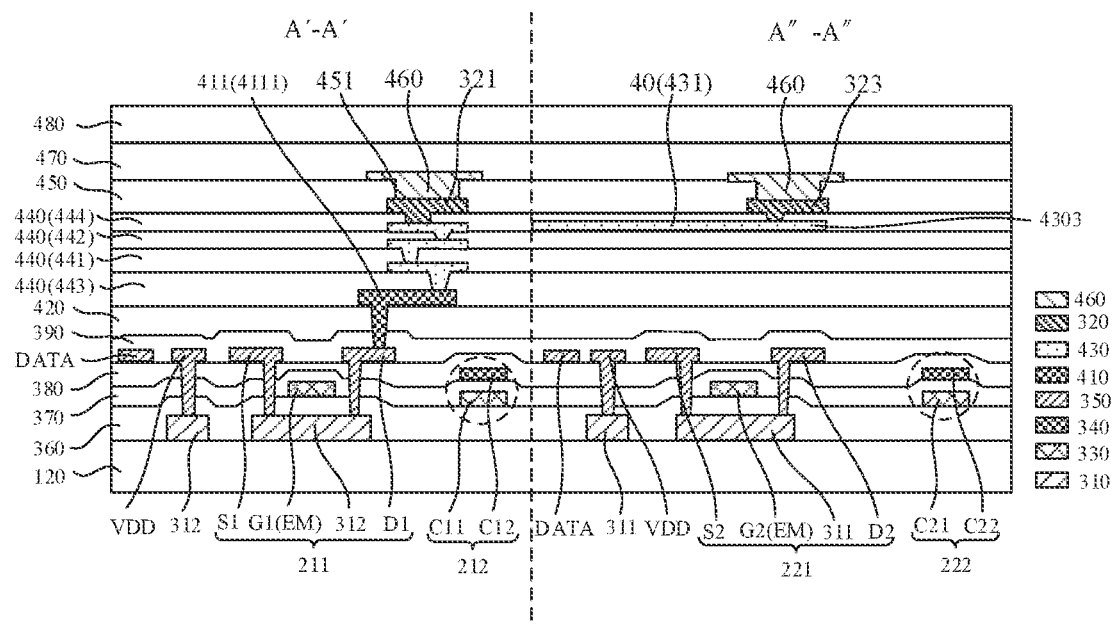
FIG. 5A is a sectional diagram taken along the A'-A' line and the A"-A" line in FIG. 4.

Referring to FIGS. 4 and 5A, the display panel 100 includes an active layer 310 and an anode layer 320 that are arranged in sequence in a direction perpendicular to the substrate 120 and away from the substrate 120. The anode layer 320 includes a plurality of first anodes 321 in the main display region 101, and each first anode 321 is electrically connected to a first pixel circuit 210. The first pixel circuit 210 is electrically connected to the first anode 321, and is configured to transmit a driving current to the first anode 321, so as to control a light-emitting device where the first anode 321 is located to emit light.

The redundant pixel circuit 220 includes at least redundant active layer patterns 311 located in the active layer 310, and the redundant pixel circuit 220 is electrically insulated from the anode layer 320. In the process of manufacturing the pixel circuits, pixel circuits located in the region of the display panel proximate to the under-screen camera have a poor uniformity due to an influence of a manufacturing process, and the poor uniformity mainly occurs in an active layer. Therefore, the redundant pixel circuit 220 includes at least the redundant active layer patterns 311 in the active layer 310.

Figure 6:
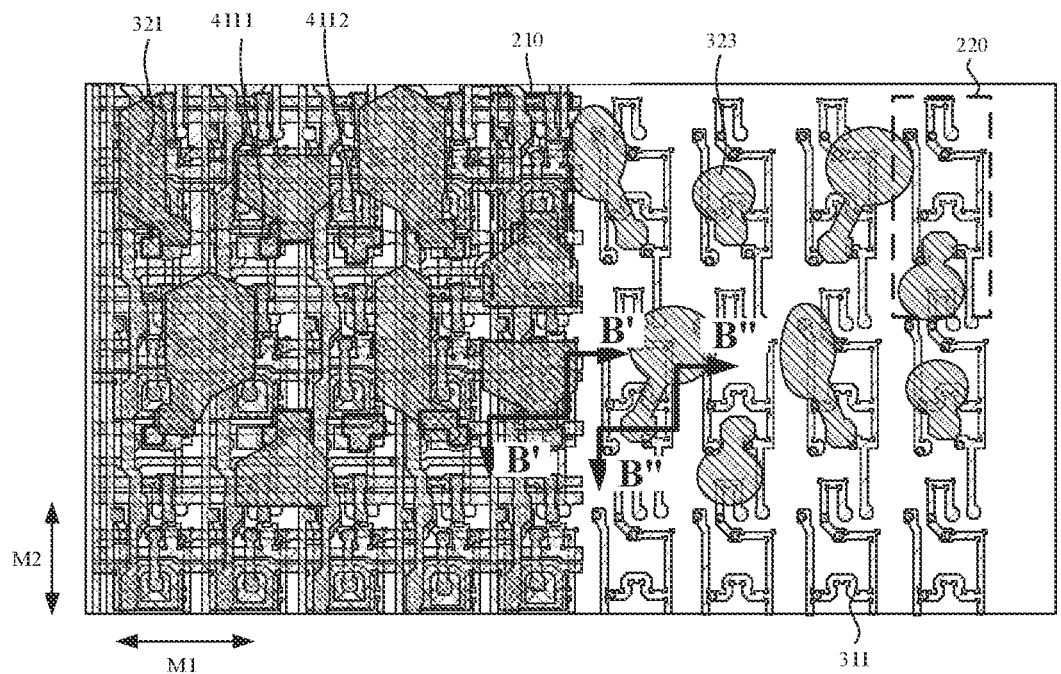
FIG. 6 is another structural diagram of sub-pixels, in accordance with some embodiments.

In the display panel 100 provided in the embodiments of the present disclosure, referring to FIGS. 3A to 3E, the redundant pixel circuits 220 adjacent to the first pixel circuits 210 are disposed at the side, proximate to the functional device region 102, of the first pixel circuits 210 located at the edge of the main display region 101 proximate to the functional device region 102; and referring to FIGS. 4 and 6, the redundant pixel circuit 220 includes the redundant active layer pattern 311 in the active layer 310. Thus, an edge of the active layer 310 proximate to the functional device region 102 is changed from first active layer patterns 312 in the first pixel circuits 210 proximate to the functional device region 102 to the redundant active layer patterns 311 in the redundant pixel circuits 220 adjacent to the first pixel circuits 210, thereby avoiding a poor uniformity of the first pixel circuits 210, and enabling sub-pixels 20 that are located at the edge of the main display region 101 proximate to the functional device region 102 to emit light normally. Moreover, the redundant pixel circuits 220 are electrically insulated from the anode layer 320. That is, the redundant pixel circuits 220 do not control any sub-pixel 110 to emit light, and even if the redundant active layer patterns 311 in the redundant pixel circuits 220 have a poor uniformity, the light emission of any sub-pixel 110 is not affected.

In some embodiments, referring to FIG. 3A, the plurality of first pixel circuits 210 are arranged in rows and columns. Any row of first pixel circuits 210 is arranged in the first direction M1 (i.e., the horizontal direction in FIG. 3A), and any column of first pixel circuits 210 is arranged in the second direction M2 (i.e., the vertical direction in FIG. 3A).

At least two redundant pixel circuits 220 arranged in the first direction are disposed at an edge, proximate to the functional device region 102, of any row of first pixel circuits 210 intersecting with the boundary of the functional device region 102. At least two redundant pixel circuits 220 arranged in the second direction are disposed at an edge, proximate to the functional device region 102, of any column of first pixel circuits 210 intersecting with the boundary of the functional device region 102. That is, for each first pixel circuit 210 located at the edge of the main display region 101 proximate to the functional device region 102, at least two redundant pixel circuits 220 adjacent to the first pixel circuit 210 are disposed at a side of the first pixel circuit 210 proximate to the functional device region 102 in the first direction M1 or the second direction M2, so as to ensure that a region with poor uniformity possibly occurring in the active layer 310 completely falls into the redundant active layer patterns 311 in the redundant pixel circuits 220, which is beneficial to improving a yield of the display panel 100.

The larger the number of the redundant pixel circuits 220 disposed at the side, proximate to the functional device region 102, of the first pixel circuits 210 in an edge region of the main display region 101 proximate to the functional device region 102, the larger the area of a region occupied by the redundant pixel circuits 220.

Therefore, two to four redundant pixel circuits 220 arranged in the first direction are disposed at the edge, proximate to the functional device region 102, of a row of first pixel circuits 210 intersecting with the boundary of the functional device region 102. Similarly, two to four redundant pixel circuits 220 arranged in the second direction are disposed at the edge, proximate to the functional device region 102, of a column of first pixel circuits 210 intersecting with the boundary of the functional device region 102. Thus, on a premise of ensuring that the first pixel circuits 210 located at the edge of the main display region 101 proximate to the functional device region 102 do not have the problem of poor uniformity, an influence of the redundant pixel circuits on the light transmittance of the functional device region 102 is reduced as much as possible.

For example, referring to FIG. 3A, the functional device region 102 is located in the middle of the display panel 100 in the first direction M1, and any row of first pixel circuits 210 intersecting with the boundary of the functional device region 102 are divided into two parts by the functional device region 102. In first pixel circuits 210 located in an N-th row and at a left side of the functional device region 102, a right side of a rightmost first pixel circuit 210 is provided with at least two redundant pixel circuits 220 adjacent to this first pixel circuit 210. For example, two, three or four redundant pixel circuits 220 may be provided.

In first pixel circuits 210 located in an M-th row and at a right side of the functional device region 102, a left side of a leftmost first pixel circuit 210 is provided with at least two redundant pixel circuits 220 adjacent to this first pixel circuit 210. In first pixel circuits 210 located in an O-th column and at a lower side of the functional device region 102, an upper side of an uppermost first pixel circuit 210 is provided with at least two redundant pixel circuits 220 adjacent to this first pixel circuit 210. In first pixel circuits 210 located in a P-th column and at an upper side of the functional device region 102, a lower side of a lowermost first pixel circuit 210 is provided with at least two redundant pixel circuits 220 adjacent to this first pixel circuit 210. The N-th row of first pixel circuits 210 and the M-th row of first pixel circuits 210 intersect with the boundary of the functional device region 102, and the O-th column of first pixel circuits 210 and the P-th column of first pixel circuits 210 intersect with the boundary of the functional device region 102.

For example, referring to FIG. 3A, four redundant pixel circuits 220 arranged in the first direction M1 are disposed at the edge, proximate to the functional device region 102, of a row of first pixel circuits 210 intersecting with the boundary of the functional device region 102; and two redundant pixel circuits 220 arranged in the second direction M2 are disposed at the edge, proximate to the functional device region 102, of a column of first pixel circuits 210 intersecting with the boundary of the functional device region 102.

Figure 3C:
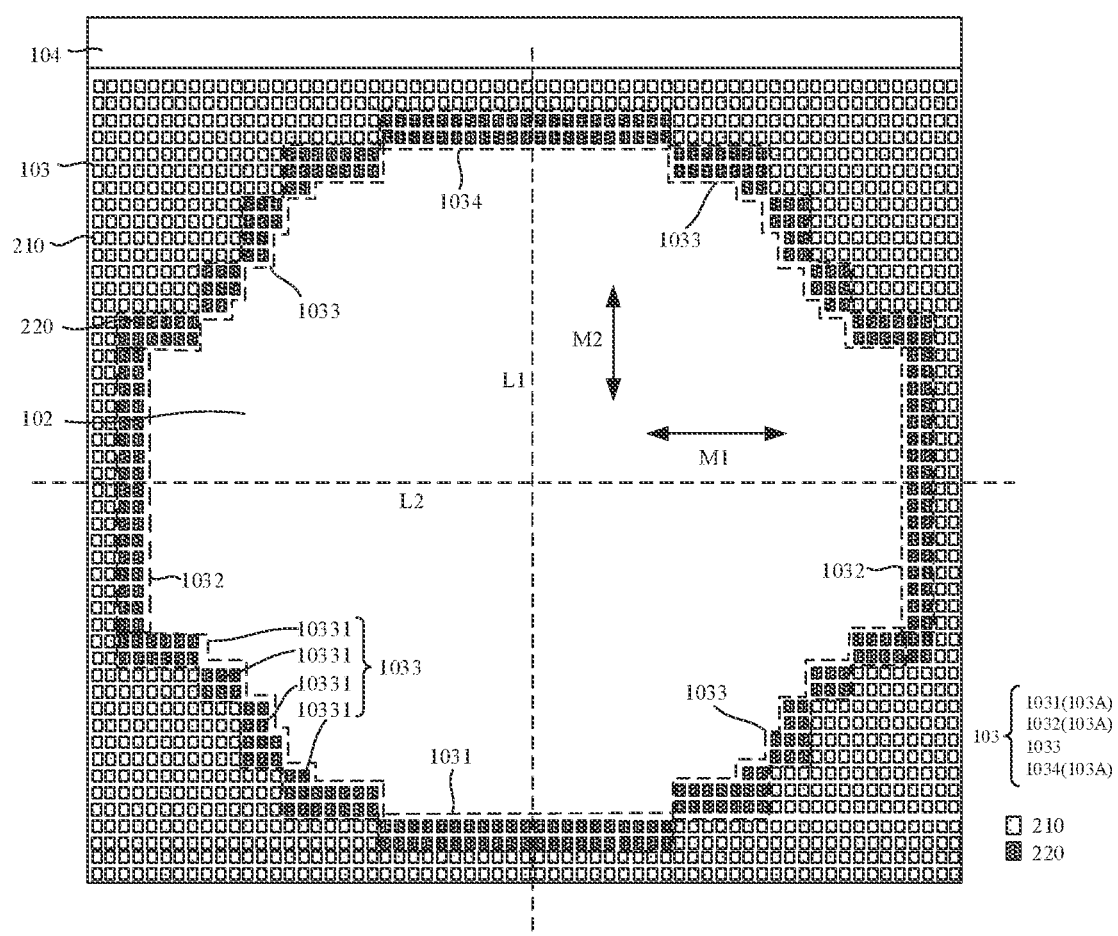
FIG. 3C is a structural diagram of yet another transition region, in accordance with some embodiments.

For example, referring to FIG. 3C, two redundant pixel circuits 220 arranged in the first direction M1 are disposed at the edge, proximate to the functional device region 102, of a row of first pixel circuits 210 intersecting with the boundary of the functional device region 102; and two redundant pixel circuits 220 arranged in the second direction M2 are disposed at the edge, proximate to the functional device region 102, of a column of first pixel circuits 210 intersecting with the boundary of the functional device region 102.

In some embodiments, a partial region of the main display region 101 proximate to the functional device region 102 is defined as a transition region 103. That is, the main display region 101 includes the transition region 103 adjacent to the functional device region 102. The redundant pixel circuits 220 are disposed in the transition region 103.

Depending on a shape difference of the functional device, the boundary of the functional device region 102 may have a different shape, and thus the transition region 103 may have a different shape. For example, the boundary of the functional device region 102 may be rectangular or approximate rectangular, circular or approximate circular, which is not specifically limited here.

The plurality of first pixel circuits 210 are arranged in rows and columns. The boundary of the functional device region 102 constitutes by alternately connecting sub-boundaries each corresponding to first pixel circuits 210 arranged in the first direction M1 (a row direction in which first pixel circuits 210 are arranged) and sub-boundaries each corresponding to first pixel circuits 210 arranged in the second direction M2 (a column direction in which first pixel circuits 210 are arranged). Referring to FIG. 3B, in a case where the part of the boundary of the functional device region 102 coincides with the part of the boundary of the bezel region 104, the boundary of the functional device region 102 includes at least a linear segment extending in the first direction M1 and two linear segments extending in the second direction M2.

Corresponding to the boundary of the functional device region 102, the transition region 103 includes a plurality of sub-transition regions 103A each located at a side of the functional device region 102. Redundant pixel circuits 220 arranged in rows and columns are disposed in the sub-transition region 103A. In a same sub-transition region 103A, the number and the structure of redundant pixel circuits 220 in a row are the same as the number and the structure of redundant pixel circuits 220 in an adjacent row, respectively. That is, the number of redundant pixel circuits 220 in each row is the same, and the redundant pixel circuits 220 in each row have the same structure.

Corresponding to the boundary of the functional device region 102, the transition region 103 includes at least a first sub-transition region 1031 and two second sub-transition regions 1032. In the second direction M2, the first sub-transition region 1031 is located at a side of the functional device region 102. That is, the first sub-transition region 1031 is located at an edge of the transition region 103 proximate to the functional device region 102 in the second direction M2. In the first direction M1, the two second sub-transition regions 1032 are respectively located on two opposite sides of the functional device region 102.

For example, referring to FIG. 3B, the boundary of the functional device region 102 is rectangular, and a sub-boundary (i.e., an upper boundary of the functional device region 102 in FIG. 3B) of the functional device region 102 in the first direction M1 partially coincides with the boundary of the bezel region 104. In this case, the transition region 103 may include the first sub-transition region 1031 and the two second sub-transition regions 1032. A boundary of the first sub-transition region 1031 constitutes a sub-boundary of the functional device region 102 in the first direction M1 (i.e., a lower boundary of the functional device region 102 in FIG. 3B). Boundaries of the two second sub-transition regions 1032 proximate to each other respectively constitute two sub-boundaries of the functional device region 102 in the second direction (i.e., a left boundary and a right boundary of the functional device region 102 in FIG. 3B).

The first sub-transition region 1031 is provided with redundant pixel circuits 220 in at least two rows therein (at least two redundant pixel circuits 220 arranged in the second direction M2 are disposed at the edge, proximate to the functional device region 102, of any column of first pixel circuits 210 intersecting with the boundary of the functional device region 102).

Each second sub-transition region 1032 is provided with redundant pixel circuits 220 in at least two columns therein (at least two redundant pixel circuits 220 arranged in the first direction M1 are disposed at the edge, proximate to the functional device region 102, of any row of first pixel circuits 210 intersecting with the boundary of the functional device region 102).

In some embodiments, referring to FIGS. 3A and 3C, the transition region 103 further includes four polyline transition regions 1033. Each polyline transition region 1033 includes a plurality of line segment regions 10331 (i.e., sub-regions) connected in sequence, and each line segment region 10331 is provided with redundant pixel circuits 220 in rows therein. Redundant pixel circuits 220 in rows located in a line segment region 10331 and redundant pixel circuits 220 in rows located in a different line segment region 10331 are staggered in the first direction M1. The first sub-transition region 1031 is connected to the second sub-transition regions 1032 through respective polyline transition regions 1033.

For example, the boundary of the functional device region 102 is approximately circular, and a corner of the boundary of the functional device region 102 is formed by a polyline segment formed by alternately connecting a plurality of linear segments extending in the first direction M1 and a plurality of linear segments extending in the second direction M2. Corresponding to the polyline segment of the boundary of the functional device region 102, the transition region 103 includes the polyline transition region 1033, and the polyline transition region 1033 of the transition region 103 is provided at a position corresponding to the polyline segment of the boundary of the functional device region 102.

The position of the functional device region 102 in the display panel 100 is not unique. The transition region 103 may have a different shape according to a different position of the functional device region 102 in the display panel 100. For example, the functional device region 102 may be provided in the middle of an upper portion of the display panel 100 (as shown in FIG. 3A), or provided on a left or light side of the upper portion of the display panel 100, or provided in the middle of a lower portion of the display panel 100. The functional device region 102 may be completely surrounded by the main display region 101 (as shown in FIG. 3C). Alternatively, the part of the boundary of the functional device region 102 may coincide with the part of the boundary of the bezel region 104. That is, the main display region 101 is located at part of the sides of the functional device region 102 (as shown in FIG. 3A).

Referring to FIG. 3A, in a case where the upper boundary of the functional device region 102 coincides with the part of the boundary of the bezel region 104, the transition region 103 has an annular shape with an opening 1035 at a side (i.e., the upper side) of the functional device region 102, and the opening 1035 is located at an edge of the transition region 103 opposite to the first sub-transition region 1031.

The transition region 103 may include only the first sub-transition region 1031 and the two second sub-transition regions 1032 (as shown in FIG. 3B). Alternatively, the transition region 103 further includes two polyline transition regions 1033 or four polyline transition regions 1033 (as shown in FIG. 3A). The transition region 103 may further include other sub-transition region(s), which will not be listed here.

Referring to FIG. 3C, in a case where the boundary of the functional device region 102 is entirely located within the main display region 101, the transition region 103 further includes a third sub-transition region 1034, and the third sub-transition region 1034 is located at the edge of the transition region 103 opposite to the first sub-transition region 1031. The third sub-transition region 1034 includes redundant pixel circuits 220 in at least two rows. The transition region 103 has a closed annular shape. Boundaries of the first sub-transition region 1031 and the third sub-transition region 1034 proximate to each other respectively constitute two sub-boundaries of the functional device region 102 in the first direction M1 (in FIG. 3C, the upper and lower boundaries of the functional device region 102).

For example, the transition region 103 may include the first sub-transition region 1031, the two second sub-transition regions 1032, and the third sub-transition region 1034. Alternatively, the transition region 103 may further include two polyline transition regions 1304 or four polyline transition regions 1033. The transition region 103 may further include other sub-transition region(s), which will not be listed here.

Figure 3D:
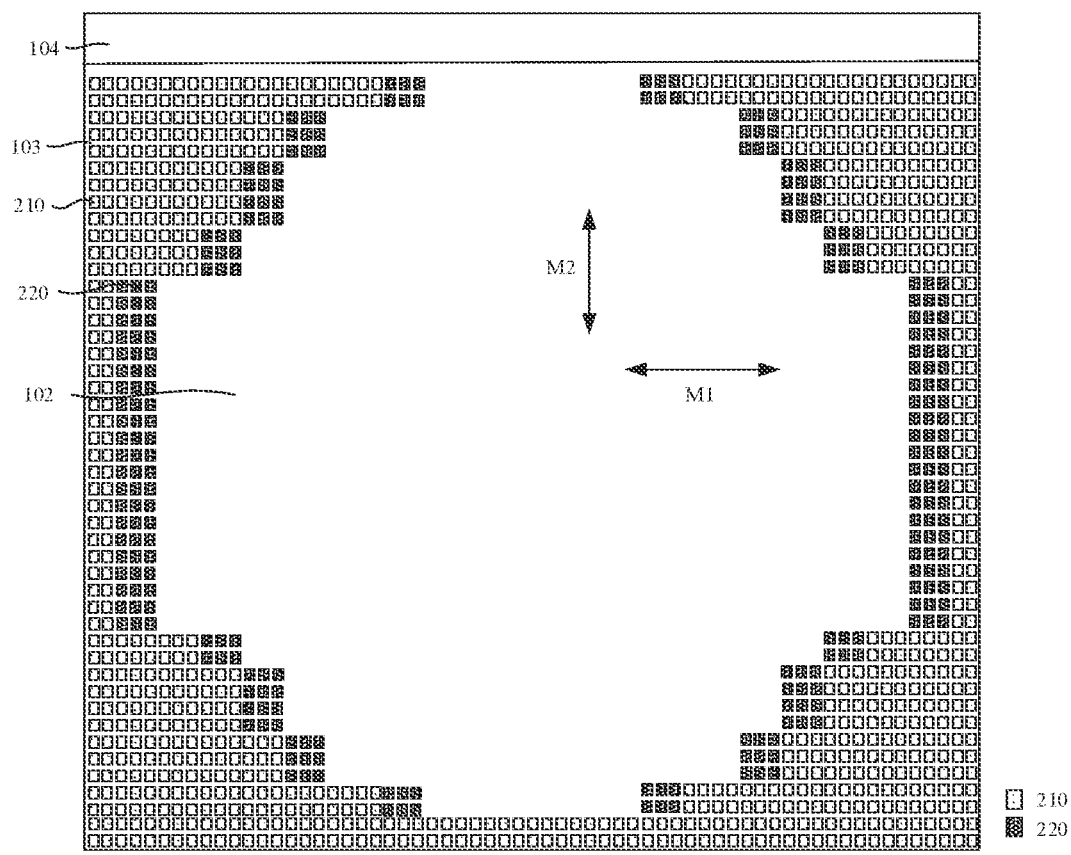
FIG. 3D is a structural diagram of yet another transition region, in accordance with some embodiments.
Figure 3E:
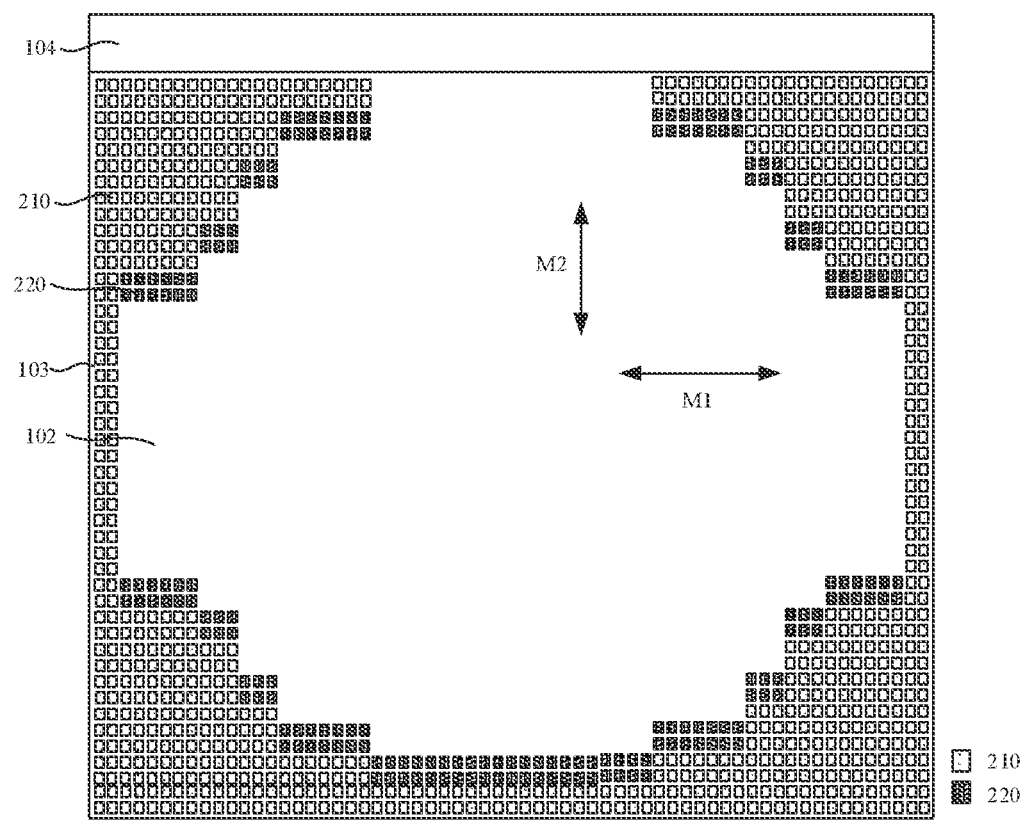
FIG. 3E is a structural diagram of yet another transition region, in accordance with some embodiments.

In some embodiments, referring to FIG. 3D, at least two redundant pixel circuits 220 arranged in the first direction M1 may be disposed only the edge, proximate to the functional device region 102, of any row of first pixel circuits 210 intersecting with the boundary of the functional device region 102. Alternatively, referring to FIG. 3E, at least two redundant pixel circuits 220 arranged in the second direction M2 may be disposed only the edge, proximate to the functional device region 102, of any column of first pixel circuits 210 intersecting with the boundary of the functional device region 102.

In some embodiments, referring to FIG. 3C, the plurality of redundant pixel circuits 220 are arranged to form a pattern, which is symmetrical with respect to the L2 line of the transition region 103 in the first direction M1. In some embodiments, referring to FIGS. 3A, 3B and 3C, the plurality of redundant pixel circuits 220 are arranged to form a pattern, which is symmetrical with respect to the L1 line of the transition region 103 in the second direction M2. The plurality of redundant pixel circuits 220 are symmetrical with respect to the L2 line of the transition region 103 in the first direction M1, and/or are symmetrical with respect to the L1 line of the transition region 103 in the second direction M2, which is beneficial to improving a uniformity of the redundant active layer patterns 311 in the redundant pixel circuits 220, so as to improve a uniformity of the entire active layer 310.

Figure 8A:
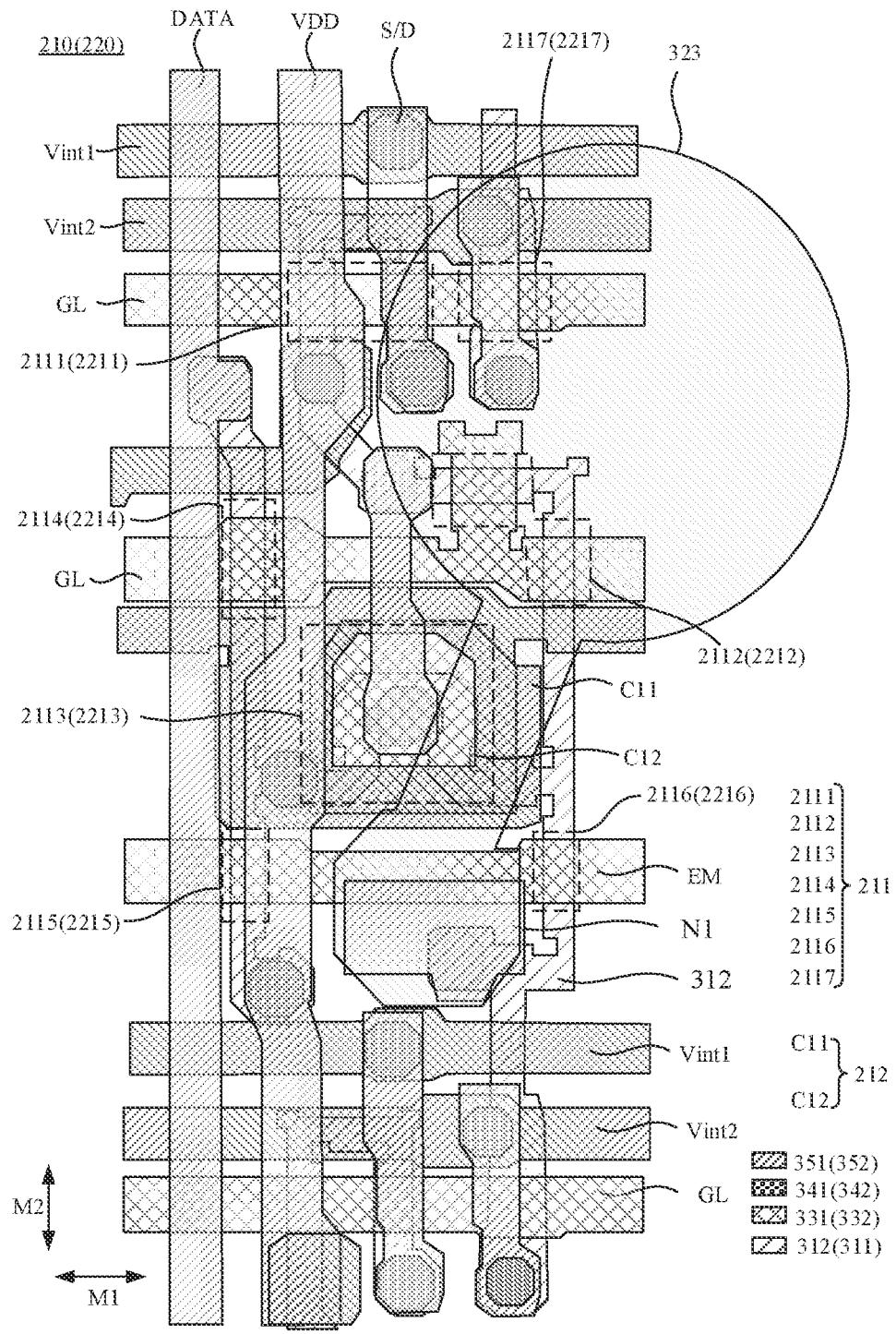
FIG. 8A is a structural diagram of a first pixel circuit, in accordance with some embodiments.

In some embodiments, referring to FIGS. 4, 5A and 8A, the first pixel circuit 210 includes a plurality of first thin film transistors (TFT) 211 and a first storage capacitor 212. The A'-A' portion in FIG. 5 is a sectional view of a first thin film transistor 211 and the first storage capacitor 212 in the first pixel circuit 210. The first thin film transistors 211 may be P-type transistors or N-type transistors, which will not be specifically limited here.

The active layer 310 includes first active layer patterns 312 of the first thin film transistors 211 in the plurality of first pixel circuits 210, and each first thin film transistor 211 includes a first active layer pattern 312 in the active layer 310.

Referring to FIGS. 4, 5A and 8A, the display panel 100 further includes a first gate conductive layer 330, a second gate conductive layer 340, and a source-drain conductive layer 350.

The first gate conductive layer 330 is disposed between the active layer 310 and the anode layer 320, and includes the first gate patterns 331 in the plurality of first pixel circuits 210. The first gate patterns 331 include gates G1 of the first thin film transistors 211 in the plurality of first pixel circuits 210, first electrode plates C11 of the first storage capacitors 212 in the plurality of first pixel circuits 210, scan lines GL, and light-emitting control lines EM.

The second gate conductive layer 340 is disposed between the first gate conductive layer 330 and the anode layer 320, and includes second gate patterns 341 in the plurality of first pixel circuits 210. The second gate patterns 341 include second electrode plates C12 of the first storage capacitors 212 in the plurality of first pixel circuits 210, first initialization signal lines Vint1, and second initialization signal lines Vint2.

The source-drain conductive layer 350 is disposed between the second gate conductive layer 340 and the anode layer 320, and includes source-drain conductive patterns 351 in the plurality of first pixel circuits 210. The source-drain conductive patterns 351 include sources S1 and drains D1 of the first thin film transistors 211 in the plurality of first pixel circuits 210, data lines DATA and voltage signal lines VDD. A first active layer pattern 312, first gate patterns 331 (i.e., a gate G1 and a first electrode plate C11), a second pattern 341 (i.e., a second electrode plate C12) and source-drain conductive patterns 351 (i.e., a source S1 and a drain D1) together constitute the first pixel circuit 210.

Referring to FIGS. 4 and 8A, the voltage signal lines VDD extend in the second direction M2, and a voltage signal line VDD is electrically connected to at least one column of first pixel circuits 210. For example, there are a plurality of voltage signal lines VDD, and each voltage signal line VDD is electrically connected to a column of first pixel circuits 210. The plurality of voltage signal lines VDD are connected in parallel, so as to reduce a resistance of the voltage signal lines VDD.

In some embodiments, referring to FIGS. 4 and 8A, the plurality of first thin film transistors include a driving transistor 2113. Two adjacent first pixel circuits 210 in the second direction M2 are provided with a first initialization signal line Vint1 and a second initialization signal line Vint2 therebetween.

For example, referring to FIG. 8A, an upper side and a lower side (two sides in the second direction M2) of the first pixel circuit 210 are each provided with a first initialization signal line Vint1 and a second initialization signal line Vint2. The first initialization signal line Vint1 on the upper side provides an initialization signal to this first pixel circuit 210 (the first pixel circuit 210 shown in the figure), and the second initialization signal line Vint2 on the upper side provides an initialization signal to the first pixel circuit 210 in a previous row. Similarly, the first initialization signal line Vint1 on the lower side provides an initialization signal to the first pixel circuit 210 in a next row, and the second initialization signal line Vint2 on the lower side provides an initialization signal to this first pixel circuit 210.

In some embodiments, the first initialization signal line Vint1 and the second initialization signal line Vint2 between the two adjacent first pixel circuits 210 are also located between first storage capacitors 212 of the two first pixel circuits 210.

Figure 5B:
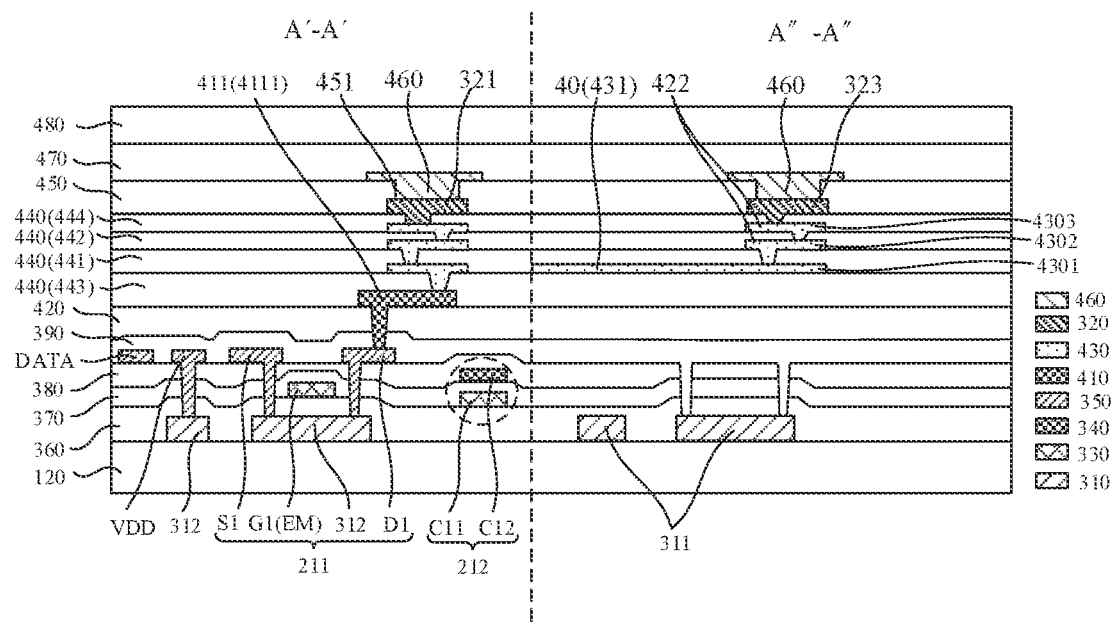
FIG. 5B is another sectional diagram taken along the A'-A' line and the A"-A" line in FIG. 4.

In some embodiments, as shown in FIGS. 5A and 5B, the display panel 100 further includes a first gate insulating layer 360 disposed between the active layer 310 and the first gate conductive layer 330, a second gate insulating layer 370 disposed between the first gate conductive layer 330 and the second gate conductive layer 340, an interlayer insulating layer 380 disposed between the second gate conductive layer 340 and the source-drain conductive layer 350, and both a passivation layer 390 and a planarization layer 420 disposed between the source-drain conductive layer 350 and the anode layer 320. The first gate insulating layer 360, the second gate insulating layer 370, the interlayer insulating layer 380, the passivation layer 390 and the planarization layer 420 are all of a whole-layer structure, and cover the redundant active layer patterns 311. At least one insulating layer is disposed between two adjacent conductive layers, so as to avoid overlapping of patterns in the two adjacent conductive layers.

The redundant pixel circuit 220 may include only redundant active layer patterns 311. Alternatively, the redundant pixel circuit 220 may include the redundant active layer patterns 311, first redundant gate patterns 332, second redundant gate patterns 342 and redundant source-drain conductive layer patterns 352 that are sequentially stacked on the substrate 120.

Figure 7:
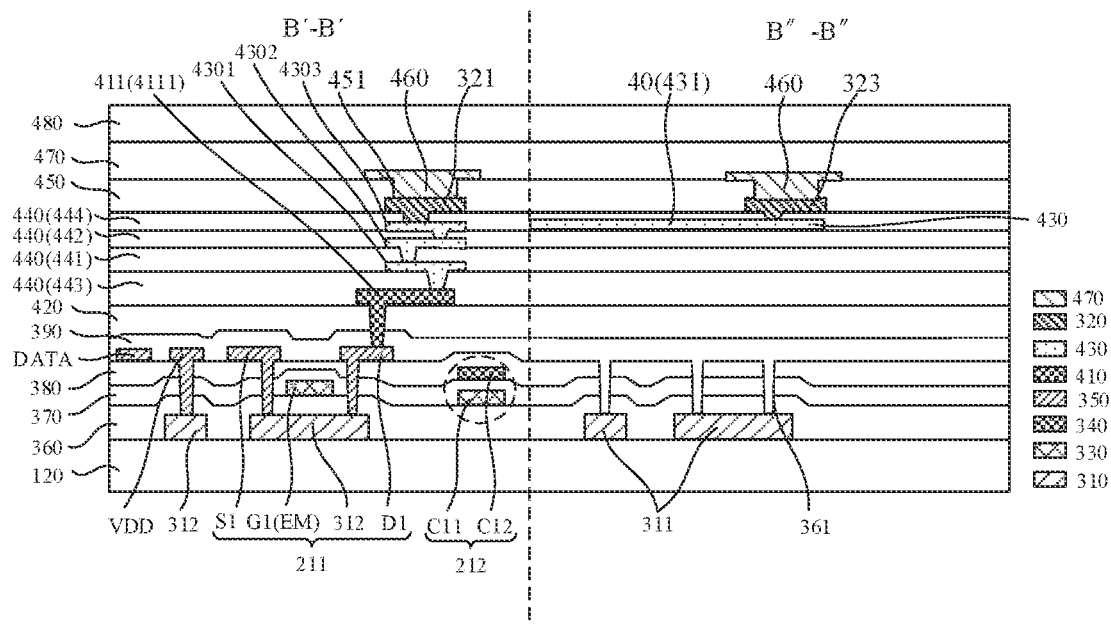
FIG. 7 is a sectional diagram taken along the B'-B' line and the B"-B" line in FIG. 6.

Referring to FIGS. 6 and 7, in a case where the redundant pixel circuit 220 includes only the redundant active layer patterns 311, orthogonal projections of all patterns in the first gate conductive layer 330, all patterns in the second gate conductive layer 340, and all patterns in the source-drain conductive layer 350 on the substrate 120 are separated from orthogonal projections of the redundant active layer patterns 311 in the plurality of redundant pixel circuits on the substrate 120. That is, conductive patterns in the first gate conductive layer 330, the second gate conductive layer 340 and the source-drain conductive layer 350 do not exist above the redundant active layer patterns 311. In this way, the redundant pixel circuit 210 has a simple structure, and patterns in the first gate conductive layer 330, the second gate conductive layer 340 and the source-drain conductive layer 350 are simple, which is beneficial to improving a manufacturing efficiency of the display panel 100.

Referring to FIG. 7, a plurality of via holes 361 are provided in the first gate insulating layer 360, the second gate insulating layer 370, and the interlayer insulating layer 380, and the plurality of via holes 361 each penetrates through the first gate insulating layer 360, the second gate insulating layer 370, and the interlayer insulating layer 380. Moreover, an orthogonal projection of the via hole 361 on the substrate 120 is within an orthogonal projection of a redundant active layer pattern 311 on the substrate 120. Therefore, a structure of the redundant active layer pattern 311 in the redundant pixel circuit 220 is consistent with a structure of the first active layer pattern 312 in the first pixel circuit 210, which is beneficial to improving a uniformity of the edge of the active layer 310 proximate to the functional device region 102, so as to reduce a possibility of a poor uniformity of the first active layer patterns 312.

The redundant pixel circuit 220 include only the redundant active layer patterns 311, and the passivation layer 390 is disposed on a side of the interlayer insulating layer 380 away from the redundant active layer patterns 311; according to the manufacturing process of the display panel 100, after the via holes 361 are formed, the source-drain conductive layer 350 and the passivation layer 390 are required to be manufactured; and therefore, via holes in the first pixel circuits 210 are filled with a material of the source-drain conductive layer 350, and via holes 361 in the redundant pixel circuits 220 are filled with a material of the passivation layer 390.

Referring to FIGS. 4, 5A, 8A and 8B, the redundant pixel circuit 220 includes a plurality of redundant thin film transistors 221 and a redundant storage capacitor 222. That is, the redundant pixel circuit 220 includes the redundant active layer patterns 311, the first redundant gate patterns 332, the second redundant gate patterns 342 and the redundant source-drain conductive layer patterns 352 that are sequentially stacked on the substrate 120. FIG. 8A is a structural diagram of the first pixel circuit 210. In a case where the redundant pixel circuit 220 includes the plurality of redundant thin film transistors 221 and the redundant storage capacitor 222, the structure of the redundant pixel circuit 220 is the same as the structure of the first pixel circuit 210. Therefore, conductive layer patterns in the redundant pixel circuit 220 may refer to corresponding conductive layer patterns in the first pixel circuit 210.

The first gate conductive layer 330 further includes first redundant gate patterns 332 in the plurality of redundant pixel circuits 220. The first redundant gate patterns 332 include gates G2 of the redundant thin film transistors 221 in the plurality of redundant pixel circuits 220 and first electrode plates C21 of the redundant storage capacitors 222 in the plurality of redundant pixel circuits 220. Moreover, the first redundant gate patterns 332 and the first gate patterns 331 are arranged in a same layer.

The second gate conductive layer 340 further includes second redundant gate patterns 342 in the plurality of redundant pixel circuits 220. The second redundant gate patterns 342 include second electrode plates C22 of the redundant storage capacitors 222 in the plurality of redundant pixel circuits 220. Moreover, the second redundant gate patterns 342 and the second gate patterns 341 are arranged in a same layer.

The source-drain conductive layer 350 further includes redundant source-drain conductive patterns 352 in the plurality of redundant pixel circuits 220. The redundant source-drain conductive patterns 352 include sources S2 and drains D2 of the redundant thin film transistors 221 in the plurality of redundant pixel circuits 220. The redundant source-drain conductive patterns 352 are electrically insulated from the anode layer 320. Moreover, the redundant source-drain conductive patterns 352 and the source-drain conductive patterns 351 are arranged in a same layer.

The redundant pixel circuit 220 includes the plurality of redundant thin film transistors 221 and the redundant storage capacitor 222, and the redundant pixel circuit 220 and the first pixel circuit 210 are the same in structure (however, the redundant pixel circuit 220 is not electrically connected to the anode layer 320, and the first pixel circuit 210 is electrically connected to the first anode 321 of the anode layer 320), which may improve a uniformity of first gate patterns 331, second gate patterns 341 and source-drain conductive patterns 351 in first pixel circuits 210 at the edge of the main display region 101 proximate to the functional device region 102. As a result, a uniformity of the first pixel circuits 210 at the edge of the main display region 101 proximate to the functional device region 102 is better, and a possibility of the $V_{th}$ shift of the first pixel circuits 210 at the edge of the main display region 101 proximate to the functional device region 102 is further reduced, so as to make light-emitting devices at the edge of the main display region 101 proximate to the functional device region 102 emit light normally.

In some embodiments, in two adjacent redundant pixel circuits 220 in the first direction M1, redundant active layer patterns 311 are separated from each other (refer to FIG. 6), the first redundant gate patterns 332 are connected, and second redundant gate patterns 342 are connected. In two adjacent redundant pixel circuits 220 in the second direction M2, redundant active layer patterns 311 are separated from each other (refer to FIG. 6), and redundant source-drain conductive patterns 352 are connected. That is, in the case where the redundant pixel circuit 220 includes the plurality of redundant thin film transistors 221 and the redundant storage capacitor 222, in two adjacent redundant pixel circuits 220 in the first direction, redundant active layer patterns 311 are separated from each other, the first redundant gate patterns 332 are connected, and the second redundant gate patterns 342 are connected. In two adjacent redundant pixel circuits 220 in the second direction M2, the redundant active layer patterns 311 are separated from each other, and the redundant source-drain conductive patterns are connected.

It will be understood that in the case where the redundant pixel circuit 220 includes only the redundant active layer patterns 311 in the active layer 310, redundant active layer patterns 311 in two adjacent redundant pixel circuits 220 in the first direction M1 are separated from each other, and redundant active layer patterns 311 in two adjacent redundant pixel circuits 220 in the second direction M2 are separated from each other.

Figure 9:
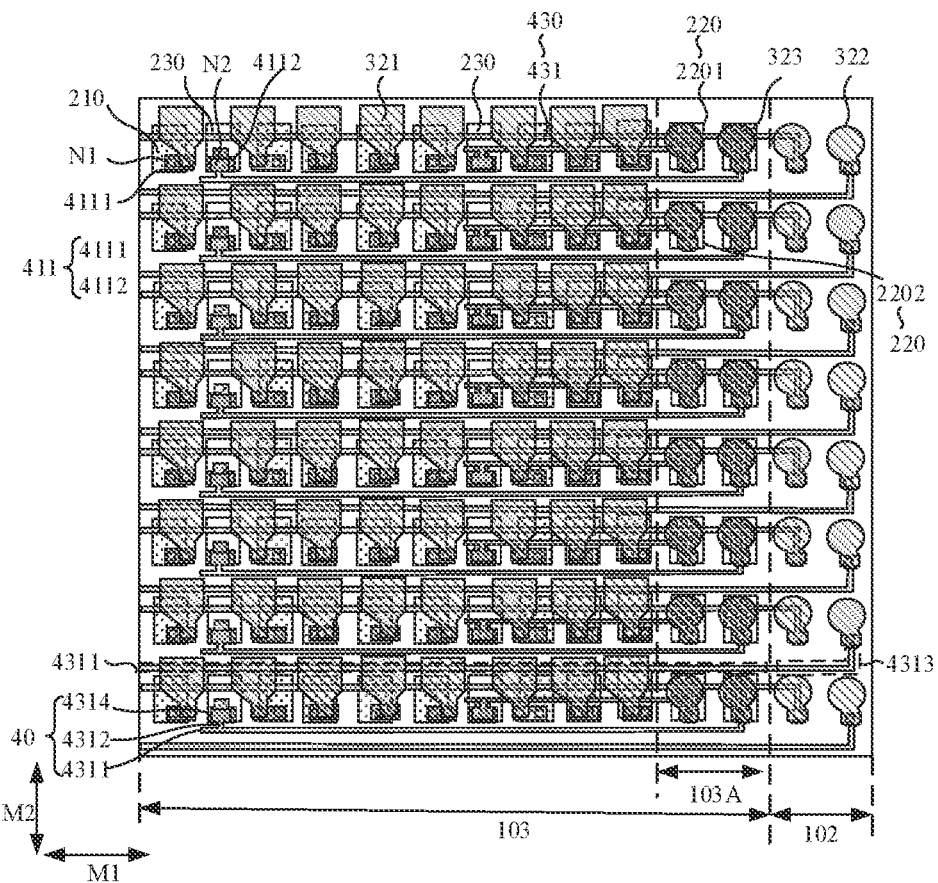
FIG. 9 is a structural diagram of second pixel circuits disposed in a main display region, in accordance with some embodiments.
Figure 10:
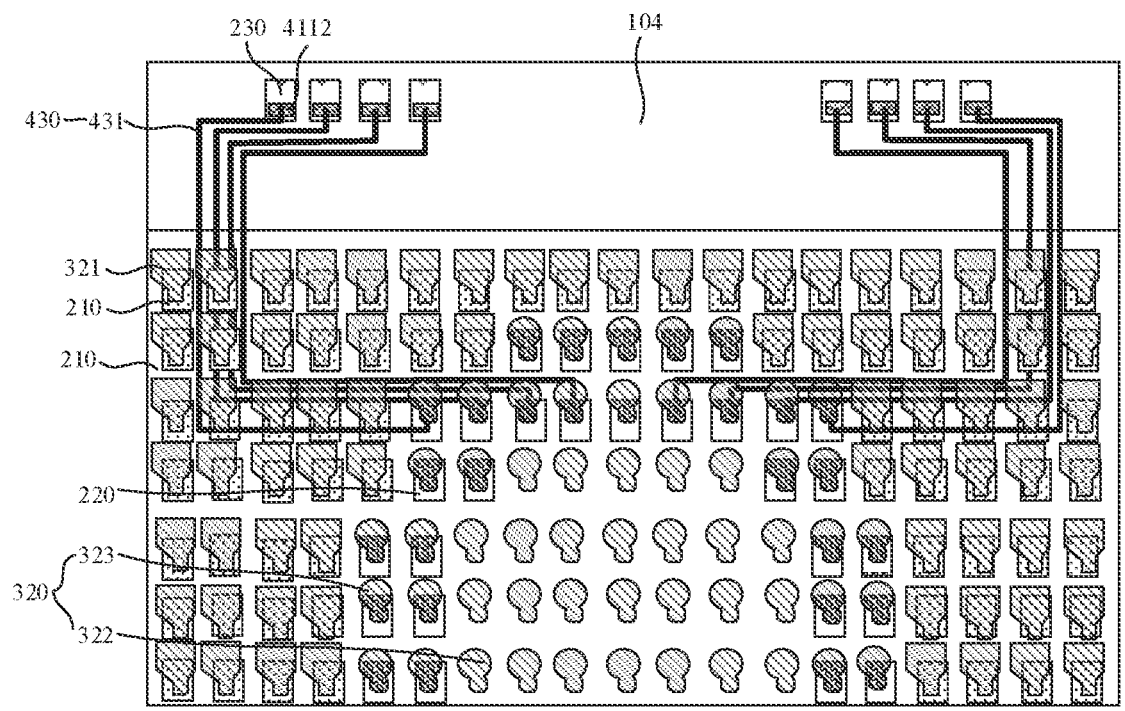
FIG. 10 is a structural diagram of second pixel circuits disposed in a bezel region, in accordance with some embodiments.

In some embodiments, referring to FIG. 9 or FIG. 10, the anode layer 320 further includes a plurality of second anodes 322 in the functional device region 102. The display panel 100 further includes a plurality of second pixel circuits 230, and each second anode 322 is electrically connected to a second pixel circuit 230. The plurality of second pixel circuits 230 are disposed in the region of the display panel 100 other than the functional device region 102. A structure of the second pixel circuit 230 may be the same as the structure of the first pixel circuit 210. The second pixel circuits 230 are disposed in the region of the display panel 100 other than the functional device region 102, which is beneficial to improving the light transmittance of the functional device region 102, so that the functional device is able to collect enough light when it operates.

In some embodiments, referring to FIG. 9, the display panel 100 further includes a plurality of connection lines 40, and each second anode 322 is electrically connected to the second pixel circuit 230 through a connection line 40.

In some embodiments, referring to FIGS. 9 and 10, the anode layer 320 further includes a plurality of third anodes 323, and orthogonal projections of the plurality of third anodes 323 on the substrate 120 are overlapped with orthogonal projections of the plurality of redundant pixel circuits 220 on the substrate 120. That is, an anode 32 whose orthogonal projection on the substrate 120 is overlapped with an orthogonal projection of the redundant pixel circuit 220 on the substrate 120 is the third anode 323. Each third anode 323 is electrically connected to a second pixel circuit 230 through a connection line. The connection line 40 includes a first line segment 4311 extending in the first direction M1, a second line segment 4312 extending in the second direction M2, and a connection block 4314 that are located in the transition region 103. The first line segment 4311 is electrically connected to the second line segment 4312, and the connection block 4314 is electrically connected to the second line segment 4312. In this way, the third anode 323 is electrically connected to the second pixel circuit 230 sequentially through the first line segment 4311, the second line segment 4312, the connection block 4314 and a second transition block.

Referring to FIG. 9, the third anode 323 and the second anode 322 have a same shape and a same area, and the third anode 323 and the first anode 321 have different shapes and different areas. It will be understood that the third anode 323 and the second anode 322 have the same shape and the same area (i.e., same size), which means that the third anode 323 and the second anode 322 corresponding to sub-pixels that are configured to emit same light have the same shape and the same area. For example, a third anode 323 included in a sub-pixel that is configured to emit red light and a second anode 322 included in a sub-pixel that is configured to emit red light have a same shape and a same area.

In some embodiments, each second anode 322 is electrically connected to the second pixel circuit 230 through the connection line 40, which may refer to the above connection relationship between the third anode 323 and the second pixel circuit 230. Referring to FIG. 9, the connection line 40 includes a first line segment 4311 extending in the first direction M1 and a second line segment 4312 extending in the second direction M2 in the transition region 103, and the first line segment 4311 is electrically connected to the second line segment 4312, which is beneficial to increasing an arrangement density of sub-connection lines 431 (i.e., the connection lines 40), so as to reduce the number of connection layers 430, thereby reducing the thickness of the display panel.

The connection line 40 further includes a third line segment 4313 in the functional device region 102 and a connection block 4314 in the transition region 103. The third line segment 4313 is electrically connected to the first line segment 4311, and the connection block 4314 is electrically connected to the second line segment 4312. A material of the third line segment 4313 includes a transparent conductive material, which is beneficial to improving the light transmittance of the functional device region 102. A material of the connection block includes a metal conductive material, which is beneficial to improving a connection stability between the second line segment 4312 and a second transition block 4112.

In this way, the second anode 322 is electrically connected to the second pixel circuit 230 sequentially through the third line segment 4313, the first line segment 4311, the second line segment 4312, the connection block 4314 and the second transition block.

In some embodiments, the display panel 100 further includes a transition conductive layer 410. The first pixel circuit 210 and the second pixel circuit 230 are electrically connected to the first anode 321 and the second anode 322 through the transition conductive layer 410, respectively. The transition conductive layer 410 is located between a film layer where the plurality of first pixel circuits 210 and the plurality of second pixel circuits 230 are located and the anode layer 320, and between the passivation layer 390 and the anode layer 320. The transition conductive layer 410 is able to reduce a depth of a via hole when the source-drain conductive layer 350 is connected to the anode layer 320, so as to improve a connection stability between the pixel circuit 20 and the light-emitting device and reduce a process difficulty in a manufacturing process of the via hole.

The transition conductive layer 410 includes a plurality of transition blocks 411 that are separated from each other. The plurality of transition blocks 411 include first transition blocks 4111 respectively electrically connected to the first pixel circuits 210, and second transition blocks 4112 respectively electrically connected to the second pixel circuits 230.

An orthogonal projection of the first transition block 4111 on the substrate 120 covers a first connection node N1 of the first pixel circuit 210 electrically connected thereto, and thus a connection layer 430 on a side of the first transition block 4111 away from the substrate 120 is shielded, so as to reduce or eliminate an influence of the connection layer 430 on the first connection node N1. The first transition block 4111 is electrically connected to the first connection node N1, and the first anode 321 is electrically connected to the first transition block 4111, so that the first anode 321 is electrically connected to the first pixel circuit 210 through the first transition block 4111. The first connection node N1 is a node of the first pixel circuit 210 configured to be electrically connected to the first anode 321.

An orthogonal projection of the second transition block 4112 on the substrate 120 covers a second connection node N2 of the second pixel circuit 230 electrically connected thereto, and thus the connection layer 430 on a side of the second transition block 4112 away from the substrate 120 is shielded, so as to reduce or eliminate an influence of the connection layer 430 on the second connection node N2. The second transition block 4112 is electrically connected to the second connection node N2, and the second anode 322 is electrically connected to the second transition block 4112, so that the second anode 322 is electrically connected to the second pixel circuit 230 through the second transition block 4112. The second connection node N2 is a node of the second pixel circuit 230 configured to be electrically connected to the second anode 322.

In some embodiments, a material of the transition conductive layer 410 includes metal. That is, the first transition blocks 4111 and the second transition blocks 4112 may be made of a metal material. For example, the material of the transition conductive layer 410 may include one or more of titanium, aluminum and copper. For example, the transition conductive layer 410 may include a titanium metal layer, an aluminum metal layer and another titanium metal layer that are stacked.

In some embodiments, the display panel 100 further includes the bezel region 104, and the bezel region 104 surrounds the main display region 101. The second pixel circuits 230 may be disposed in the main display region 101 (as shown in FIG. 9) or in the bezel region 104 (as shown in FIG. 10).

Referring to FIG. 9, in a case where the second pixel circuits 230 are disposed in the main display region 101, the plurality of first pixel circuits 210 and the plurality of second pixel circuits 230 are all located in the main display region 101. The plurality of second pixel circuits 230 are arranged in rows and columns, and two adjacent second pixel circuits 230 located in a same row are provided with first pixel circuits 210 therebetween. That is, columns of second pixel circuits 230 are inserted into gaps between columns of first pixel circuits 210 at intervals. The second pixel circuits 230 are disposed in the main display region 101, which is beneficial to reducing a width of the bezel region 104, so as to increase a screen-to-body ratio of the display panel 100.

In some embodiments, in the transition region 103, the number of second pixel circuits 230 is less than the number of first pixel circuits 210. In the transition region 103, second pixel circuits 230 are arranged in rows and columns, and two adjacent second pixel circuits 230 in a same row are provided with first pixel circuits 210 therebetween.

For example, referring to FIG. 9, in the first direction M1, two adjacent second pixel circuits 230 have (four) first pixel circuits 210 therebetween.

Referring to FIG. 10, the second pixel circuits 230 are disposed in the bezel region 104, which is beneficial to increasing a pixel density of the main display region 101 of the display panel 100. For example, in some display panels 100 with a high pixel density (also called pixels per inch, PPI), for a display panel 100 with a high pixel density, a density of first pixel circuits 210 is large accordingly, and available gaps between the first pixel circuits 210 are small, so that the second pixel circuits 230 are not easily inserted into the gaps between the first pixel circuits 210. Therefore, the second pixel circuits 230 are disposed in the bezel region 104, which is beneficial to increasing the pixel density of the main display region 101 of the display panel 100, and is beneficial to manufacturing a display panel 100 with a high PPI.

The second anodes 322 are located in the functional device region 102, and the second pixel circuits 230 are disposed in the region of the display panel 100 other than the functional device region 102. That is, an orthogonal projection of the second pixel circuit 230 on the substrate 120 is non-overlapped with an orthogonal projection of the second anode 322 on the substrate 120, and the second anode 322 cannot be directly electrically connected to the second pixel circuit 230 through a via hole.

Therefore, referring to FIGS. 9 and 10, the display panel 100 further includes at least one connection layer 430, and the at least one connection layer 430 is located between the transition conductive layer 410 and the anode layer 320. The connection layer(s) 430 include a plurality of sub-connection lines 431. An end of the sub-connection line 431 is electrically connected to the second pixel circuit 230 through the second transition block 4112, and another end of the sub-connection line 431 is electrically connected to the second anode 322.

The connection line 40 includes a sub-connection line 431 (i.e., including the first line segment 4311, the second line segment 4312, the third line segment 4313 and the connection block 4314), and the second anode 322 is electrically connected to the second pixel circuit 230 through the sub-connection line 431 and the second transition block 4112 electrically connected to the sub-connection line 431.

In order to improve the light transmittance of the functional device region 102, the sub-connection lines 431 in the connection layer 430 may be made of a transparent conductive material, such as indium tin oxide (ITO).

In some embodiments, referring to FIG. 9, at least two sub-connection lines 431 are disposed between two adjacent redundant pixel circuits 220 in the second direction M2, so that an arrangement density of the sub-connection lines 431 may be improved. Orthogonal projections of the at least two sub-connection lines 431 on the substrate 120 are separated from the orthogonal projections of the redundant active layer patterns 311 in the redundant pixel circuits 220 on the substrate 120, so as to reduce a risk of short circuit between two adjacent sub-connection lines 431.

Since the plurality of second anodes 322 exist in the functional device region 102, the sub-connection lines 431 are required to respectively connect the plurality of second anodes 322 to the plurality of second pixel circuits 230. The plurality of sub-connection lines 431 may be disposed in a same connection layer 430, or may be disposed in different connection layers 430 to provide sufficient wiring spaces for the plurality of sub-connection lines 431. In a case where the number of the connection layers 430 is more than two, any two adjacent connection layers 430 are provided with at least one insulating layer 440 therebetween.

For example, referring to FIGS. 5A, 5B and 7, the number of the connection layers 430 is three. In a direction perpendicular to the substrate 120 and pointing from the substrate 120 to the anode layer 320, the three connection layers 430 are a first connection layer 4301, a second connection layer 4302 and a third connection layer 4303 in sequence. An insulating layer 441 is provided between the first connection layer 4301 and the second connection layer 4302. An insulating layer 442 is provided between the second connection layer 4302 and the third connection layer 4303. An insulating layer 443 is provided between the transition conductive layer 410 and the first connection layer 4301. An insulating layer 444 is provided between the third connection layer 4303 and the anode layer 320.

Referring to FIG. 5B, in a case where the display panel 100 includes the plurality of connection layers 430, for the second pixel circuits 230 and the second anodes 322 that are required to be electrically connected through respective sub-connection lines 431, in addition to arranging the sub-connection lines 431 in one of the connection layers 430, third transition blocks 422 are further required to be provided in other connection layer(s) 430 except for the connection layer 430 where the sub-connection lines 431 are located. The second anode 322 is electrically connected to the sub-connection line 431 through the third transition block(s) 422, and/or the sub-connection line 431 is electrically connected to the second transition block 4112 through the third transition block(s) 422. The third anode 323 in FIGS. 5A and 5B taken along the A"-A" line in FIG. 4 may be considered as the second anode 322 in the functional device region 102. The third anode 323 in FIG. 7 taken along the B"-B" line in FIG. 6 may be considered as the second anode 322 in the functional device region 102.

In some embodiments, since the number of the second anodes 322 is large, second anodes 322 at different positions may be electrically connected to respective second pixel circuits 230 through sub-connection lines 431 in different connection layers 430. For example, second anodes 322 in different sub-pixels 120 in a same pixel unit (including at least a red sub-pixel, a green sub-pixel and a blue sub-pixel) are electrically connected to respective second pixel circuits 230 through sub-connection lines 431 in different layers. Alternatively, two adjacent second anodes 322 are electrically connected to respective second pixel circuits 230 through sub-connection lines 431 in different layers, which will not be listed here.

For example, referring to 5A, the second anode 322 is electrically connected to the second pixel circuit 230 through the sub-connection line 431 in the third connection layer 4303. Referring to FIG. 5B, the second anode 322 is electrically connected to the second pixel circuit 230 through the sub-connection line 431 in the first connection layer 4301.

In some embodiments, referring to FIGS. 4, 5A and 8A, the redundant pixel circuit 220 includes the plurality of redundant thin film transistors 221. In this way, the structure of the redundant pixel circuit 220 is the same as the structure of the first pixel circuit 210. The redundant pixel circuit 220 will be described by taking the redundant pixel circuit 220 (the first pixel circuit 210) shown in FIG. 8A as an example.

Figure 8B:
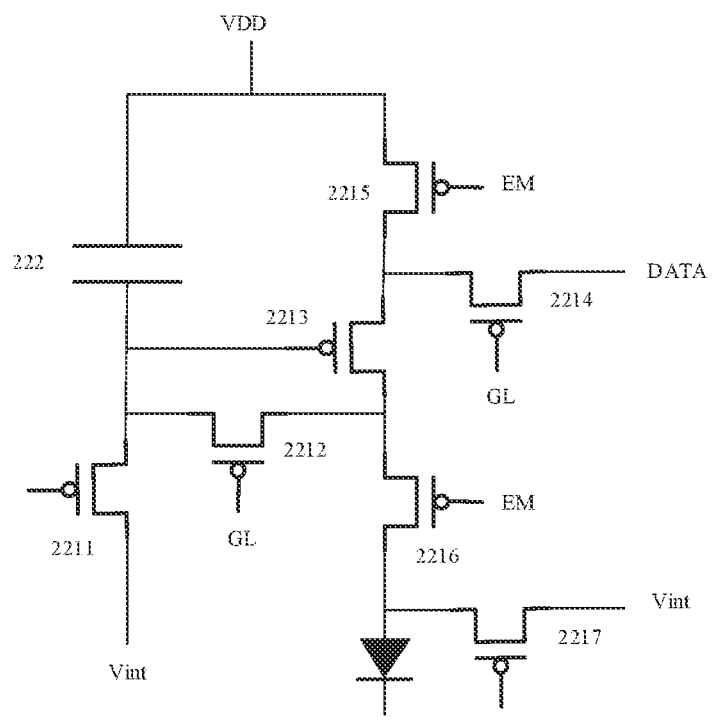
FIG. 8B is an equivalent circuit diagram of the first pixel circuit in FIG. 8A.

For example, referring to FIG. 8B (FIG. 8B is an equivalent circuit diagram of the redundant pixel circuit 220 shown in FIG. 8A), the plurality of redundant thin film transistors 221 include a first redundant initialization transistor 2211, a redundant compensation transistor 2212, a redundant driving transistor 2213, a redundant data writing transistor 2214, a first redundant light-emitting control transistor 2215, a second redundant light-emitting control transistor 2216, and a second redundant initialization transistor 2217.

Two adjacent redundant pixel circuits 220 in the second direction M2 include a first redundant pixel circuit 2201 and a second redundant pixel circuit 2202. A redundant pixel circuit 220 whose orthogonal projection on the substrate 120 is overlapped with the orthogonal projection of the third anode 323 on the substrate 120 is the first redundant pixel circuit 2201, and a redundant pixel circuit 220 adjacent to the first redundant pixel circuit 2201 in the second direction M2 is the second redundant pixel circuit 2202.

In some embodiments, referring to FIG. 8A, the orthogonal projection of the third anode 323 on the substrate 120 is overlapped with orthogonal projections of a gate of the redundant compensation transistor 2212 in the first redundant pixel circuit 2201, and the second redundant initialization transistor 2217 in the first redundant pixel circuit 2201 on the substrate 120.

In some embodiments, the display panel further includes the light-emitting control lines EM. The orthogonal projection of the third anode 323 on the substrate 120 is overlapped with orthogonal projections of the first redundant light-emitting control transistor 2215 in the second redundant pixel circuit and the light-emitting control line EM on the substrate.

Referring to FIG. 4, portions, covered by the orthogonal projections of respective third anodes 323, of the redundant pixel circuits 220 are different according to different positions of the third anodes 323, which will not be listed here.

In some embodiments, referring to FIG. 4, a contour of the orthogonal projection of the first anode 321 on the substrate 120 includes a plurality of linear edges 3211, which is beneficial to reducing a manufacturing difficulty of the first anode 321.

A contour of the orthogonal projection of the third anode 323 (or the second anode) on the substrate 120 includes a partially circular contour 3231 (as shown in FIG. 4), which is beneficial to reducing an area of the second anode or the third anode 323, so as to improve the light transmittance of the functional device region 102.

In some embodiments, referring to FIGS. 9 and 10, a pixel density of the functional device region 102 is the same as the pixel density of the main display region 101. The pixel density refers to a density of light-emitting devices. That is, a density of light-emitting devices in the functional device region 102 is equal to a density of light-emitting devices in the main display region 101, which is beneficial to improving a uniformity of an image displayed on the display panel 100.

In some embodiments, referring to FIGS. 5A, 5B and 7, the display panel 100 further includes a pixel defining layer 450 disposed on a side of the anode layer 320 away from the substrate 120. The pixel defining layer 450 includes a plurality of opening regions 451, and the first anode 321 or the second anode 322 corresponds to an opening region 451.

The opening region 451 is provided with a light-emitting functional layer 460 therein. For example, the light-emitting functional layer 460 includes one or more of an electron transport layer (ETL), an electron injection layer (EIL), a hole transport layer (HTL) and a hole injection layer (HIL).

The display panel 100 further includes a cathode conductive layer 470 disposed on a side of the pixel defining layer 450 and the light-emitting functional layers away from the substrate 120, and an encapsulation layer 480 disposed on a side of the cathode conductive layer 470 away from the substrate 120.

Some embodiments of the present disclosure further provide a method for manufacturing a display panel 100. The display panel 100 has a main display region 101 and a functional device region 102, and the main display region 101 is located at at least part of sides of the functional device region 102. The display panel 100 includes a plurality of first pixel circuits 210 and a plurality of redundant pixel circuits 220. The plurality of first pixel circuits 210 are located in the main display region 101, and the plurality of redundant pixel circuits 220 are adjacent to first pixel circuits 210 in the main display region 101 proximate to the functional device region 102.

The manufacturing method includes following steps.

In S10, an active layer 310 is manufactured on a substrate 120.

The active layer 310 includes first active layer patterns 312 in the plurality of first pixel circuits 210 and redundant active layer patterns 311 in the plurality of redundant pixel circuits 220.

In S20, an anode layer 320 is manufactured on a side of the active layer 310 away from the substrate 120.

The anode layer 320 includes a plurality of first anodes 321 in the main display region 101, and each first anode 321 is electrically connected to a first pixel circuit 210. The plurality of redundant pixel circuits 220 are electrically insulated from the anode layer 320.

In the display panel 100 obtained by the above manufacturing method, the redundant pixel circuits 220 adjacent to the first pixel circuits 210 are disposed at a side, proximate to the functional device region 102, of the first pixel circuits 210 located at the edge of the main display region 101 proximate to the functional device region 102, and the redundant pixel circuits 220 includes the redundant active layer patterns 311 in the active layer 310, so that a poor uniformity of the first active layer patterns 312 in the first pixel circuits 210 is avoided. Therefore, sub-pixels where the first anodes 321 located at the edge of the display region 101 proximate to the functional device region 102 are located may emit light normally.

In some embodiments, the first pixel circuit 210 include a plurality of first thin film transistors 211 and a first storage capacitor 212. After the active layer 310 is manufactured on the substrate 120 in S10, and before the anode layer 320 is manufactured on the side of the active layer 310 away from the substrate 120 in S20, the manufacturing method further includes following steps.

In S11, a first gate conductive layer 330 is manufactured on the side of the active layer 310 away from the substrate 120.

The first gate conductive layer 330 includes first gate patterns 331 in the plurality of first pixel circuits 210. The first gate patterns 331 include gates G1 of the first thin film transistors 211 in the plurality of first pixel circuits 210, first electrode plates C11 of the first storage capacitors 212 in the plurality of first pixel circuits 210, scan lines GL, and light-emitting control lines EM.

In S12, a second gate conductive layer 340 is manufactured on a side of the first gate conductive layer 330 away from the substrate 120.

The second gate conductive layer 340 includes second gate patterns 341 in the plurality of first pixel circuits 210. The second gate patterns 341 include second electrode plates C12 of the first storage capacitors 212 in the plurality of first pixel circuits 210, first initialization signal lines Vint1, and second initialization signal lines Vint2.

In S13, a source-drain conductive layer 350 is manufactured on a side of the second gate conductive layer 340 away from the substrate 120.

The source-drain conductive layer 350 includes source-drain conductive patterns 351 in the plurality of first pixel circuits 210. The source-drain conductive patterns 351 include sources S1 and drains D1 of the first thin film transistors 211 in the plurality of first pixel circuits 210, data lines DATA, and voltage signal lines VDD.

A first active layer pattern 312, first gate patterns 331 (i.e., a gate G1 and a first electrode plate C11), a second gate pattern 341 (i.e., a second electrode plate C12) and source-drain conductive patterns 351 (i.e., a source S1 and a drain D1) together constitute the first pixel circuit 210.

In some embodiments, the redundant pixel circuit 220 may include only redundant active layer patterns 311, or may include the redundant active layer patterns 311, first redundant gate patterns 332, second redundant gate patterns 342, and redundant source-drain conductive layer patterns 352 that are sequentially stacked on the substrate 120.

In a case where the redundant pixel circuit 220 includes only the redundant active layer patterns 311, orthogonal projections of all patterns in the first gate conductive layer 330, all patterns in the second gate conductive layer 340, and all patterns in the source-drain conductive layer 350 on the substrate 120 are separated from orthogonal projections of the redundant active layer patterns 311 on the substrate 120.

The redundant pixel circuit 220 includes a plurality of redundant thin film transistors 221 and a redundant storage capacitor 222. That is, the redundant pixel circuit 220 includes the redundant active layer patterns 311, the first redundant gate patterns 332, the second redundant gate patterns 342, and the redundant source-drain conductive layer patterns 352 that are sequentially stacked on the substrate 120.

The first gate conductive layer 330 further includes first redundant gate patterns 332 in the plurality of redundant pixel circuits 220. The first redundant gate patterns 332 include gates G2 of the redundant thin film transistors 221 in the plurality of redundant pixel circuits 220 and first electrode plates C21 of the redundant storage capacitors 222 in the plurality of redundant pixel circuits 220. The first redundant gate patterns 332 and the first gate patterns 331 are arranged in a same layer.

The second gate conductive layer 340 further includes second redundant gate patterns 342 in the plurality of redundant pixel circuits 220. The second redundant gate patterns 342 include second electrode plates C22 of the redundant storage capacitors 222 in the plurality of redundant pixel circuits 220. The second redundant gate patterns 342 and the second gate patterns 341 are arranged in a same layer.

The source-drain conductive layer 350 further includes redundant source-drain conductive patterns 352 in the plurality of redundant pixel circuits 220. The redundant source-drain conductive patterns 352 include sources S2 and drains D2 of the redundant thin film transistors 221 in the plurality of redundant pixel circuits 220. The redundant source-drain conductive patterns 352 are electrically insulated from the anode layer 320. Moreover, the redundant source-drain conductive patterns 352 and the source-drain conductive patterns 351 are arranged in a same layer.

The redundant pixel circuit 220 and the first pixel circuit 210 have a same structure. However, the redundant pixel circuits 220 are electrically insulated from the anode layer 320, and the redundant pixel circuits 220 do not control any light-emitting devices to emit light. The first pixel circuit 210 is electrically connected to the first anode 321 for controlling a light-emitting device where the first anode 321 is located to emit light. The redundant pixel circuits 220 are able to improve the uniformity of the first pixel circuits 210, so as to avoid the $V_{th}$ shift of the first pixel circuits 210, and thereby solve a problem of abnormal display of light-emitting devices connected to respective first pixel circuits 210 that are located at the edge of the main display region 101 proximate to the functional device region 102.

The foregoing descriptions are merely specific implementations of the present disclosure. However, the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a main display region and a functional device region, the main display region being located at at least part of sides of the functional device region, and a light transmittance of the main display region being less than a light transmittance of the functional device region;
the display panel comprising a plurality of first pixel circuits and a plurality of redundant pixel circuits, wherein the plurality of first pixel circuits are located in the main display region, first pixel circuits are arranged in a row of first pixel circuits in a first direction, a plurality of rows of first pixel circuits are arranged in a second direction, and the first direction intersects with the second direction; wherein
the display panel comprises a substrate, and an active layer and an anode layer that are arranged on the substrate in sequence in a direction perpendicular to the substrate and away from the substrate; wherein
the plurality of redundant pixel circuits include at least a column of redundant pixel circuits arranged in the second direction, and the column of redundant pixel circuits is located between the functional device region and a column of first pixel circuits; a redundant pixel circuit includes at least redundant active layer patterns located in the active layer, and the redundant pixel circuit is electrically insulated from the anode layer; redundant active layer patterns in two adjacent redundant pixel circuits are same, and are separated from each other.

2. The display panel according to claim 1, wherein at least two redundant pixel circuits arranged in the first direction are disposed at an edge, proximate to the functional device region, of any row of first pixel circuits intersecting with a boundary of the functional device region; and/or
at least two redundant pixel circuits arranged in the second direction are disposed at an edge, proximate to the functional device region, of any column of first pixel circuits intersecting with the boundary of the functional device region.

3. The display panel according to claim 1, wherein the main display region includes a transition region adjacent to the functional device region, and the plurality of redundant pixel circuits are located in the transition region;
the transition region includes a plurality of sub-transition regions each located at a side of the functional device region, at least one sub-transition region is provided with redundant pixel circuits arranged in rows and columns therein, and in a same sub-transition region, a number and a structure of redundant pixel circuits in a row are same as a number and a structure of redundant pixel circuits in an adjacent row, respectively.

4. The display panel according to claim 3, wherein the plurality of sub-transition regions include:
a first sub-transition region located at a side of the functional device region in the second direction, the first sub-transition region being provided with redundant pixel circuits in at least two rows therein; and
two second sub-transition regions respectively located at two opposite sides of the functional device region in the first direction, each second sub-transition region being provided with redundant pixel circuits in at least two columns therein.

5. The display panel according to claim 4, wherein the plurality of sub-transition regions further include:
four polyline transition regions, each polyline transition region including a plurality of sub-regions connected in sequence, each sub-region being provided with redundant pixel circuits in rows therein, redundant pixel circuits in rows located in a sub-region and redundant pixel circuits in rows located in a different sub-region being staggered in the first direction, and the first sub-transition region being connected to the second sub-transition regions through respective polyline transition regions.

6. The display panel according to claim 4, wherein the transition region has an annular shape with an opening at a side of the functional device region, and the opening of the transition region is opposite to the first sub-transition region in the second direction; or
the transition region has a closed annular shape, and the transition region further includes a third sub-transition region; in the second direction, the third sub-transition region is located at a side of the functional device region, and is opposite to the first sub-transition region; the third sub-transition region includes redundant pixel circuits in at least two rows.

7. The display panel according to claim 3, wherein the plurality of redundant pixel circuits are arranged to form a pattern, and the pattern is symmetrical with respect to a line of the transition region in the first direction; and/or
the plurality of redundant pixel circuits are arranged to form a pattern, and the pattern is symmetrical with respect to a line of the transition region in the second direction.

8. The display panel according to claim 1, wherein each first pixel circuit includes a plurality of first thin film transistors and a first storage capacitor; the active layer further includes first active layer patterns of the plurality of first thin film transistors;
the display panel further comprises:
a first gate conductive layer disposed between the active layer and the anode layer and including first gate patterns in the plurality of first pixel circuits, the first gate patterns including gates of the plurality of first thin film transistors, a first electrode plate of the first storage capacitor, scan lines, and light-emitting control lines;
a second gate conductive layer disposed between the first gate conductive layer and the anode layer and including second gate patterns in the plurality of first pixel circuits, the second gate patterns including a second electrode plate of the first storage capacitor, first initialization signal lines, and second initialization signal lines; and
a source-drain conductive layer disposed between the second gate conductive layer and the anode layer and including source-drain conductive patterns in the plurality of first pixel circuits, the source-drain conductive patterns including data lines and voltage signal lines; the voltage signal lines extending in the second direction, and a voltage signal line being electrically connected to first pixel circuits in at least one column.

9. The display panel according to claim 8, wherein the plurality of first thin film transistors include a driving transistor;

driving transistors of two adjacent first pixel circuits in the second direction are provided with a first initialization signal line and a second initialization signal line therebetween.

10. The display panel according to claim 8, wherein orthogonal projections of all patterns in the first gate conductive layer, all patterns in the second gate conductive layer, and all patterns in the source-drain conductive layer on the substrate are separated from orthogonal projections of redundant active layer patterns in the plurality of redundant pixel circuits on the substrate.

11. The display panel according to claim 10, further comprising:
a first gate insulating layer disposed between the active layer and the first gate conductive layer;
a second insulating layer disposed between the first gate conductive layer and the second gate conductive layer;
an interlayer insulating layer disposed between the second gate conductive layer and the source-drain conductive layer; and
a passivation layer disposed between the source-drain conductive layer and the anode layer;
wherein
the first gate insulating layer, the second gate insulating layer, the interlayer insulating layer and the passivation layer cover the redundant active layer patterns in the plurality of redundant pixel circuits;
a plurality of via holes are provided in the first gate insulating layer, the second gate insulating layer and the interlayer insulating layer, each via hole penetrates through the interlayer insulating layer, the second gate insulating layer and the first gate insulating layer, and an orthogonal projection of the via hole on the substrate is within an orthogonal projection of a redundant active layer pattern on the substrate; the via hole is filled with a material of the passivation layer.

12. The display panel according to claim 8, wherein the redundant pixel circuit includes a plurality of redundant thin film transistors and a redundant storage capacitor;
the first gate conductive layer further includes first redundant gate patterns in the plurality of redundant pixel circuits, and the first redundant gate patterns include gates of the plurality of redundant thin film transistors and a first electrode plate of the redundant storage capacitor;
the second gate conductive layer further includes second redundant gate patterns in the plurality of redundant pixel circuits, and the second redundant gate patterns include a second electrode plate of the redundant storage capacitor;
the source-drain conductive layer further includes redundant source-drain conductive patterns in the plurality of redundant pixel circuits, and the redundant source-drain conductive patterns include sources and drains of the plurality of redundant thin film transistors; the redundant source-drain conductive patterns are electrically insulated from the anode layer;
in two adjacent redundant pixel circuits in the second direction, redundant source-drain conductive patterns are connected.

13. The display panel according to claim 1, further comprising a plurality of second pixel circuits disposed in a region of the display panel other than the functional device region; wherein
the anode layer includes a plurality of first anodes and a plurality of second anodes; the plurality of first anodes are located in the main display region, and each first anode is electrically connected to a first pixel circuit; the plurality of second anodes are located in the functional device region, and each second anode is electrically connected to a second pixel circuit.

14. The display panel according to claim 13, wherein the main display region includes a transition region adjacent to the functional device region, and the plurality of second pixel circuits are located in the transition region;
in the transition region, a number of the second pixel circuits is less than a number of first pixel circuits; and/or the plurality of second pixel circuits are arranged in rows and columns, and two adjacent second pixel circuits in a same row are provided with first pixel circuits therebetween.

15. The display panel according to claim 14, further comprising a plurality of connection lines, each second anode being electrically connected to the second pixel circuit through a connection line; wherein
the connection line includes a first line segment extending in the first direction and a second line segment extending in the second direction that are located in the transition region, and the first line segment is electrically connected to the second line segment;
the connection line further includes a third line segment located in the functional device region and a connection block located in the transition region, the third line segment is electrically connected to the first line segment, and the connection block is electrically connected to the second line segment;
a material of the third line segment includes a transparent conductive material, and a material of the connection block includes a metal conductive material.

16. The display panel according to claim 15, further comprising:
a transition conductive layer located between a film layer where the plurality of first pixel circuits and the plurality of second pixel circuits are located and the anode layer; the transition conductive layer including a plurality of transition blocks that are separated from each other; the plurality of transition blocks including first transition blocks respectively electrically connected to the plurality of first pixel circuits, and second transition blocks respectively electrically connected to the plurality of second pixel circuits; and
at least one connection layer located between the transition conductive layer and the anode layer; the at least one connection layer including a plurality of sub-connection lines, an end of a sub-connection line being electrically connected to a second transition block, and another end of the sub-connection line being electrically connected to a second anode; wherein
the connection line includes the sub-connection line, including the first line segment, the second line segment, the third line segment and the connection block.

17. The display panel according to claim 16, wherein an orthogonal projection of a first transition block in the first transition blocks on the substrate covers a first connection node of a first pixel circuit electrically connected to the first transition block, and the first transition block is electrically connected to the first connection node; the first connection node is a node of the first pixel circuit configured to be electrically connected to a first anode; and
an orthogonal projection of a second transition block in the second transition blocks on the substrate covers a second connection node of a second pixel circuit electrically connected to the second transition block, and the second transition block is electrically connected to the second connection node; the second connection node is a node of the second pixel circuit configured to be electrically connected to the second anode.

18. The display panel according to claim 15, wherein at least two connection lines are disposed between two adjacent redundant pixel circuits in the second direction, and orthogonal projections of the at least two connection lines on the substrate are separated from orthogonal projections of redundant active layer patterns in the two adjacent redundant pixel circuits on the substrate.

19. The display panel according to claim 1, wherein the main display region includes a transition region adjacent to the functional device region, and the plurality of redundant pixel circuits are located in the transition region;

the anode layer includes a plurality of first anodes located in the main display region, a plurality of second anodes located in the functional device region and a plurality of third anodes located in the transition region; a third anode in the third anodes and a second anode in the second anodes have a same shape and a same area, and the third anode and a first anode in the first anodes have different shapes and different areas; and orthogonal projections of the plurality of third anodes on the substrate are separated from each other, and the orthogonal projections of the plurality of third anodes are overlapped with orthogonal projections of the plurality of redundant pixel circuits on the substrate.

20. A display device comprising the display panel according to claim 1.

* * * * *